United States Patent
Desbrun et al.

(10) Patent No.: US 10,169,498 B2
(45) Date of Patent: Jan. 1, 2019

(54) PARTICLE-BASED SIMULATION THROUGH POWER DIAGRAMS

(71) Applicant: California Institute of Technology, Pasadena, CA (US)

(72) Inventors: Mathieu Desbrun, Pasadena, CA (US); Fernando De Goes, Berkeley, CA (US)

(73) Assignee: California Institute of Technology, Pasadena, CA (US)

( * ) Notice: Subject to any disclaimer, the term of this patent is extended or adjusted under 35 U.S.C. 154(b) by 34 days.

(21) Appl. No.: 15/099,312

(22) Filed: Apr. 14, 2016

(65) Prior Publication Data

US 2016/0307359 A1 Oct. 20, 2016

Related U.S. Application Data

(60) Provisional application No. 62/147,360, filed on Apr. 14, 2015.

(51) Int. Cl.
*G06F 17/50* (2006.01)

(52) U.S. Cl.
CPC ................................ *G06F 17/5009* (2013.01)

(58) Field of Classification Search
CPC .................................................. G06F 17/5009
See application file for complete search history.

(56) References Cited

U.S. PATENT DOCUMENTS

| | | | | |
|---|---|---|---|---|
| 8,577,659 | B2* | 11/2013 | Kim | G06F 17/5009 703/6 |
| 2005/0182610 | A1* | 8/2005 | Anderson | G06F 17/5009 703/9 |
| 2011/0021256 | A1* | 1/2011 | Lundback | A63D 15/20 463/2 |
| 2012/0284002 | A1* | 11/2012 | McDaniel | G06F 17/5009 703/2 |
| 2014/0324399 | A1* | 10/2014 | Barron | G06F 17/13 703/2 |
| 2015/0227651 | A1* | 8/2015 | Gowaikar | G06F 17/5018 703/2 |

OTHER PUBLICATIONS

Onate et al., "The Particle Finite Element Method: An Overview", Int. J. Comp. Meth., vol. 1, No. 2, 2004, 267-307 pgs.
Premoze et al., "Particle-Based Simulation of Fluids", Comp. Graph., vol. 22, No. 3, 2003, 401-410 pgs.
Raveendran et al., "Hybrid Smoothed Particle Hydrodynamics", Symp. on Comp. Anim., 2011, 33-42 pgs.
(Continued)

*Primary Examiner* — Samantha (Yuehan) Wang
(74) *Attorney, Agent, or Firm* — KPPB LLP

(57) ABSTRACT

The use of power diagrams in accordance with embodiments of the invention enable particle based fluid simulation. One embodiment includes a processor, a memory containing a model of a fluid, where the fluid is broken into a set of cells each defining a volume with boundaries that are relative to a distance of a set of points, where the process is configured by the power particle application to: calculate a plurality of forces acting on the set of cells, move the set of cells within the model of the fluid based upon the plurality of forces, and update the model of the fluid with a new set of cells.

19 Claims, 22 Drawing Sheets

(56) References Cited

OTHER PUBLICATIONS

Ren et al., "Multiple-fluid SPH Simulations Using a Mixture Model", ACM Trans. Graph., vol. 33, Issue No. 5, 2014, 11 pgs.
Rycroft, "Voro++: A three dimensional Voronoi cell library in C++", Chaos: An Interdisciplinary Journal of Non-linear Science, 19, 2009.
Schechter et al., "Ghost SPH for Animating Water", ACM Trans. Graph., vol. 31, No. 4, 2012, 8 pgs.
Serrano et al., "Voronoi Fluid Particle Model for Euler Equations", J. Statistical Physics, vol. 121, 2005, 133-147 pgs.
Shadloo et al., "Improved incompressible Smoothed Particle Hydrodynamics method for simulating flow around bluff bodies", Comput. Methods in Appl. Mech. Eng., vol. 200, Issues 9-12, 2011, 1008-1020 pgs.
Shao et al., "Incompressible SPH method for simulating Newtonian and non-Newtonian flows with a free surface", Advances in Water Resources 26, 7, 2003, 787-800 pgs.
Side Effects, "Houdini Engine", http://www.sidefx.com, 2014.
Sin et al., "A Point-Based Method for Animating Incompressible Flow", Symp. on Comp. Anim., 2009, 247-255 pgs.
Solenthaler et al., "Density contrast Sph interfaces", Symp. on Comp. Anim., 2008, 211-218 pgs.
Solenthaler et al., "Predictive-Corrective Incompressible SPH", ACM Trans. Graph., vol. 28, Issue 3, 2009, 6 pgs.
Solenthaler et al., "SPH-based Shallow Water Simulation", VRIPHYS, 2011, 29-46 pgs.
Springel, "E pur si muove: Galilean-invariant cosmological hydrodynamic simulations on a moving mesh", Mon. Not. Roy. Astron. Soc., vol. 401, No. 2, 2010, 791-851 pgs.
Stam et al., "Depicting Fire and Other Gaseous Phenomena Using Diffusion Process", SIGGRAPH, 1995, 129-136 pgs.
STAM, "Stable Fluids", SIGGRAPH, 1999, 121-128 pgs.
Steinhoff et al., "Modification of the Euler equations for Vorticity Confinement: Application to the Computation of Interacting Vortex Rings", Physics of Fluids 6, 8, 1994, 2738-2744 pgs.
Takahashi et al., "Implicit Formulation for SPH-based Viscous Fluids", Eurographics, vol. 34, No. 2, 2015.
Tang, "Moving Mesh Methods for Computational Fluid Dynamics", Contemporary Mathematics, No. 383, 2004, 141-173 pgs.
Whitehurst, "A free Lagrange Method for gas dynamics", Mon. Not. Roy. Aston. Soc. 277, 2, 1995, 655-680 pgs.
Yan et al., "Computing 2D Periodic Centroidal Voronoi Tessellation", Int. Symp. on Voronoi Diagrams, 2011, 177-184 pgs.
Yan et al., "Efficient computation of Clipped Voronoi Diagram", Computer-Aided Design 45, 4, 2013, 843-852 pgs.
Zheng et al., "A New Incompressibility Discretization for a Hybrid Particle Mac Grid Representation With Surface Tension", J. of Comp. Phys., vol. 280, 2015, 96-142 pgs.
Zhu et al., "Animating Sand as a Fluid", ACM Trans. Graph, vol. 24, Issue 3, 2005, 965-972 pgs.
Adams et al., "Adaptively sampled particle fluids", Acm Trans. Graph., vol. 26, Issue 3, 2007, 7 pgs.
Akinci et al., "Versatile surface tension and adhesion for SPH fluids", ACM Trans. Graph., vol. 32, Issue 6, 2013.
Alduan et al., "SPH granular flow with friction and cohesion", Symp. on Comp. Anim., 2011, 219-228.
Ando et al., "Highly adaptive liquid simulations on tetrahedral meshes", ACM Trans. Graph., vol. 32, Issue 4, 2013, 10 pgs.
Aurenhammer et al., "Minkowski-type theorems and least-squares clustering", Algorithmica, vol. 20, Issue 1, 1998, 61-76 pgs.
Aurenhammer, "Power Diagrams: Properties, Algorithms, and Applications", SIAM J. on Computing, vol. 16, No. 1, 1987, 78-96 pgs.
Batty et al., "Accurate viscous free surfaces for buckling, coiling, and rotating liquids", Symp. on Comp. Anim. 2008, 219-228 pgs.
Becker et al., "Weakly compressible SPH for free surface flows", Symp. on Comp. Anim, 2007, 209-217 pgs.
Bodin et al., "Constraint Fluids", IEEE Trans. Vis. Comput. Graphics 18, 2012, 516-526 pgs.
Boyd et al., "MultiFLIP for energetic two-phase fluid simulation", ACM Trans. Graph. vol. 31, No. 2, 2012, 12 pgs.
Brackbill et al., "FLIP: A low-dissipation, particle-in-cell method for fluid flow", Computer Physics Communications, vol. 48, Issue 1, 1988, 25-38 pgs.
Brochu et al., "Matching Fluid Simulation Elements to Surface Geometry and Topology", ACM Trans. Graph., vol. 29, Issue 4, 2010, 9 pgs.
Busaryev et al., "Animating Bubble Interactions in a Liquid Foam", ACM Trans. Graph, vol. 31, Issue 4, 2012.
CGAL, "Computational Geometry Algorithms Library (release 4.5)", http://www.cgal.orq/, 2015.
Clausen et al., "Simulating Liquids and Solid-Liquid Interactions with Lagrangian Meshes", ACM Trans. Graph., vol. 32, No. 2, 2013, 15 pgs.
Clavet et al., "Particle-based viscoelastic fluid simulation", Symp. on Comp. Anim., 2005, 12 pgs.
Cornelis et al., "IISPH-FLIP for incompressible fluids", Comp. Graph. Forum, vol. 33, Issue 2, 2014.
Cummins et al., "An SPH Projection Method", J. Comp. Physics 152, 2, 1999, 584-607 pgs.
De Goes et al., "Blue noise through optimal transport", ACM Trans. Graph., vol. 31, Issue 6, 2012, 6 pgs.
De Goes et al., "On the Equilibrium of Simplicial Masonry Structures", ACM Trans. Graph., vol. 32, Issue 4, 2013, 9 pgs.
De Goes, "Power Particles: An incompressible fluid solver based on power diagrams", http://www.geometry.caltech.edu/pubs/dGWH+15.pdf, 2015.
Desbrun et al., "Smoothed Particles: A new paradigm for animating highly deformable bodies", EG Computer Animation Symp., 1996, 61-76 pgs.
Ellero et al., "Incompressible Smoothed Particle Hydrodynamics", J. Comp. Physics, vol. 226, Issue 2, 2007, 1731-1752 pgs.
Enright et al., "A Fast and Accurate Semi-Lagrangian Particle Level Set Method", Comput. Struc. Issue 83, 2005, 6-7, 25 pgs.
Erleben et al., "Mathematical Foundation of the Optimization-Based Fluid Animation Method", Symp. on Comp. Anim., 2011, 101-110 pgs.
Feldman et al., "Fluids in Deforming Meshes", Symp. in Comp. Anim., 2005, 255-259 pgs.
Golin et al., "On the average complexity of 3d Voronoi diagrams of random points on convex polytopes", Computational Geometry, vol. 25, Issue 3, 2003, 197-231 pgs.
Harlow, "The Particle-In-Cell Method for Numerical Solution of Problems in Fluid Dynamics", Experimental arithmetic, high-speed computations and mathematics, 1963. 43 pgs.
He et al., "Local Poisson SPH for Viscous Incompressible Fluids", Comp. Graph. Forum, vol. 31, No. 6, 2012, 1948-1958 pgs.
Hietel et al., "A finite-volume particle method for compressible flows", Math. Models Methods Appl. Sci., vol. 10, Issue 9, 2000, 1363-1382 pgs.
Hong et al., "Discontinuous fluids", ACM Trans. Graph., vol. 24, Issue 3, 2005, 7 pgs.
Hu et al., "An incompressible multiphase SPH method", J. Comp. Physics 227, 1, 2007.
Ihmsen et al., "A parallel SPH implementation on multi-core CPUs", Comp. Graph. Forum, vol. 30, Issue 1, 2011, 99-112 pgs.
Ihmsen et al., "Implicit Incompressible SPH", IEEE Trans. Vis. Comput. Graphics, 2013, 11 pgs.
Ihmsen et al., "SPH fluids in computer graphics", Eurographics STAR report, 2014, 23 pgs.
Irving et al., "Volume conserving finite element simulations of deformable models", ACM Trans. Graph., vol. 26, Issue 3, 2007, 6 pgs.
Kang et al., "Incompressible SPH Using the Divergence-Free Condition", Comp. Graph Forum, vol. 33, Issue 7, 2014, 219-228 pgs.
Klinger et al., "Fluid Animations With Dynamic Meshes", ACM Trans. Graph., vol. 25, Issue 3, 2006, 6 pgs.
Lee et al., "Solving the Shallow Water equations using 2D SPH particles for interactive applications", The Visual Computer, vol. 26, 2010, 2-8, 865-872 pgs.
Liu et al., "Computing Self-Supporting Surfaces by Regular Triangulation", AMC Trans. Graph., vol. 32, Issue 4, 2013, 8 pgs.

(56) References Cited

OTHER PUBLICATIONS

Lloyd, "Least Squares Quantization in PCM", IEEE Trans. Inf. Theory, vol. 28, No. 2, 1982, 129-137 pgs.
Losasso et al., "Two-way coupled SPH and Particle Level Set Fluid Simulation", IEEE Trans. Vis. Comput. Graphics, vol. 12, Issue 4, 2008, 797-804 pgs.
Lucy, "A numerical approach to the testing of the fission hypothesis", Astronomical Journal, vol. 82, 1977, 1013-1024 pgs.
Macklin et al., "Position based fluids", ACM Trans. Graph., vol. 32, Issue 4, 2013, 5 pgs.
Misztal et al., "Multiphase Flow of Immiscible Fluids on Unstructured Moving Meshes", ACM SIGGRAPH Symposium on Computer Animation, 2012.
Monaghan, "Smoothed Particle Hydrodynamics", Reports on Progress in Physics 68, 2005, 1703-1759 pgs.
Monaghan, "SPH without a Tensile Instability", J. Comp. Physics 159, 2, 2000, 290-311 pgs.
Mullen et al., "Energy-Preserving Integrators for Fluid Animation", ACM Trans. Graph., vol. 28, Issue 3, 2009, 8 pgs.
Mullen et al., "HOT: Hodge-Optimized Triangulations", AMC Trans. Graph., vol. 30, Issue 4, 2011, 11 pgs.
Muller et al., "Particle Based Fluid Simulation for Interactive Applications", Symp. on Comp. Anim., 2003, 7 pgs.
Museth, "VDB: High-Resolution Sparse Volumes With Dynamics Topology", ACM Trans. Graph., vol. 32, No. 3, 2013, 22 pgs.
Adams, et al., "Adaptively sampled particle fluids", ACM Trans. Graph. 26, 3.
Akinci, et al., "Versatile surface tension and adhesion for SPH fluids", ACM Trans. Graph. 32, 6.
Alduan, et al., "SPH granular flow with friction and cohesion", Symp. on Conp. Anim. 219-228.
Ando, et al., "Highly adaptive liquid simulations on tetrahedral meshes", ACM Trans. Graph. 32, 4.
Aurenhammer, et al., "Minkowski-type theorems and least-squares clustering", Algorithmica 20, 61-76.
Aurenhammer, "Power Diagrams: Properties, Algorithms, and Applications", SIAM J. on Computing 16(1), 78-96.
Batty, et al., "Accurate viscous free surfaces for buckling, coiling, and rotating liquids", Symp. on Comp. Anim.
Becker, et al., "Weakly compressible SPH for free surface flows", Symp. on Comp. Anim, 209-217.
Bodin, et al., "Constraint Fluids", IEEE Trans. Vis. Comput. Graphics 18, 516-526.
Boyd, et al., "MultiFLIP for energetic two-phase fluid simulation", ACM Trans. Graph. 31, 2.
Brackbill, et al., "FLIP: A low-dissipation, particle-in-cell method for fluid flow", Computer Physics Communications 48, 1, 25-38.
Brochu, et al., "Matching fluid simuation elements to surface geometry and topology", ACM Trans. Graph. 29,4.
Busaryev, et al., "Animating bubble interactions in a liquid foam", ACM Trans. Graph 31, 4.
CGAL, "Computational Geometry Algorithms Library", http://www.cgal.org/.
Clausen, et al., "Simulating liquids and solid-liquid interactions with lagrangian meshes", ACM Trans. Graph. 32,2.
Clavet, et al., "Particle-based viscoelastic fluid simulation", Symp. on Comp. Anim. 219-228.
Cornelis, et al., "IISPH-FLIP for incompressible fluids", Comp. Graph. Forum 33, 2.
Cummins, et al., "An SPH Projections method", J. COmp. Physics 152, 2 584-706.
De Goes, et al., "Blue noise through optimal transport", ACM Trans. Graph. 31,6.
De Goes, et al., "On the equilibrium of simplicial masonry structures", ACM Trans. Graph. 31,6.
De Goes, "Power Particles: An incompressible fluid solver based on power diagrams", http://www.geometry.caltech.edu/pubs/dGWH+15.pdf.
Desbrun, et al., "Smoothed Particles: A new paradigm for animating highly deformable bodies", EG Computer Animation Symp., 61-76.
Ellero, et al., "Incompressible Smoothed Particle Hydrodynamics", J. Comp. Physics 226, 2, 1731-1752.
Enright, et al., "A fast and accurate semi-Lagrangian particle level set method", Comput. Struc. 83, 6-7, 479-490.
Erleben, et al., "Mathematical foundation of the optimization-based fluid animation method", Symp. on Comp. Anim. 101-110.
Feldman, et al., "Fluids in deforming meshes", Symp. in Comp. Anim. 225-259.
Golin, et al., "On the average complexity of 3d Voronoi diagrams of random points on convex polytopes", Computational Geometry 25, 3, 197-231.
Harlow, "The Particle-in-cell method for numerical solution of problems in fluid dynamics." Experimental arithmetic, high-speed computations and mathematics.
He, et al., "Local Poisson SPH for viscous incompressible fluids", Comp. Graph. Forum 31, 6, 1948-1958.
Hietel, et al., "A finite-volume particle method for compressible flows", Math. Models Methods Appl. Sci. 10, 9, 1363-1382.
Hong, et al., "Discontinuous fluids", ACM Trans. Graph. 24, 3.
Hu, et al., "An incompressible multiphase SPH method", J. Comp. Physics 227, 1, 264-278.
Ihmsen, et al., "A parallel SPH implementation on multi-core CPUs", Comp. Graph. Forum 30, 1, 99-112.
Ihmsen, et al., "Implicit lmcompressible SPH", IEEE Trans. Vis. Comput. Graphics 99.
Ihmsen, et al., "SPH fluids in computer graphics", Eurographics STAR report.
Irving, et al., "Volume conserving finite element simulations of deformable modles", ACM Trans. Graph. 26, 3.
Kang, et al., "Incompressible SPH using the divergence-free condition", Comp. Graph Forum 33, 7, 219-228.
Klinger, et al., "Fluid animations with dynamic meshes", ACM Trans. Graph. 25,3.
Lee, et al., "Solving the shallow water equations using 2D SPH particles for interactive applications", The Visual Computer 26, 2-8, 865-872.
Liu, et al., "Computing Self-supporting surfaces by regular triangulation", AMC Trans. Graph. 32,4.
Lloyd, "Least Squares quantization in PCM", IEEE Trans. Inf. Theory. 28, 2, 129-137.
Losasso, et al., "Two-way coupled SPH and particle level set fluid simulation", IEEE Trans. Vis. Comput. Graphics 12, 4, 797-804.
Lucy, "A numerical approach to the testing of the fission hypothesis.," Astronomical Journal 82, 1013-1024.
Macklin, et al., "Position based fluids," ACM Trans. Graph. 32,4.
Misztal, et al., "Multiphase flow of immiscible fluids on unconstructed moving meshes", IEEE. Trans. Vis. Comput. Graphics 20, 1.
Monaghan, "Smoothed Particle Hydrodynamics", Reports on Progress in Physics 68, 1703-1759.
Monaghan, "SPH without a tensile instability", J. Comp. Physics 159, 2, 290-3-11.
Mullen, et al., "Energy-preserving integrators for fluid animation", ACM Trans. Graph. 28, 3.
Mullen, et al., "HOT: Hodge-Optimized Triangulations", AMC Trans. Graph. 30,4.
Muller, et al., "Particle based fluid simulation for interactive applications", Symp. on Comp. Anim. 154-159.
Museth, "VDB: High-resolution sparse volumes with dynamics topology", ACM Trans. Graph. 32,3.
Onate, et al., "The Particle Finite Element Method: An Overview," Int. J. Comp. Meth. 1, 2, 267-307.
Premoze, et al., "Particle-based simulation of fluids", Comp. Graph. Forum 22, 3, 401-410.
Raveendran, et al., "Hybrid Smoothed Particle Hydrodynamics", Symp. on Comp. Anim. 33-42.
Ren, et al., "Multiple-fluid sph simulations using a mixture model", ACM Trans. Graph. 33,5.
Rycroft, "Voro++: A three dimensional Voronoi cell library in C++", Chaos: An Interdisciplinary Journal of Non-linear Science 19,4.
Schechter, et al., "Ghost SPH for animating water", ACM Trans. Graph. 31,4.
Serrano, et al., "Voronoi fluid particle model for Euler equations", J. Statistical Physics 121, 133-147.

(56) References Cited

OTHER PUBLICATIONS

Shadloo, et al., "Improved incompressible Smoothed Particle Hydrodynamics method for simulating flow around bluff bodies," Comput. Methods in Appl. Mech. Eng. 200, 9-12, 1008-1020.
Shao, et al., "Incompressible SPH method for Simulating Newtonian and non-Newtonian flows with a free surface", Advances in water Resources 26, 7, 787-800.
Side Effects, "Houdini Engine", http://www.sidefx.com/.
Sin, et al., "A point-based method for animating incompressible flow", Symp. on Comp. Anim. 247-255.
Solenthaler, et al., "Density contrast SPH interfaces", Symp. on Comp. Anim. 211-218.
Solenthaler, et al., "Predictive-corrective incompressible SPH.", ACM Trans. Graph. 28, 3.
Solenthaler, et al., "SPH-based Shallow water simulation", VRIPHYS, 29-46.
Springel, "E pur si Muove: Galilean-invariant cosmological hydrodynamic simulations on a moving mesh", Mon. Not. Roy. Astron. Soc. 401, 2, 791-851.
Stam, et al., "Depicting fire and other gaseous phenomena using diffusion process", SIGGRAPH, 129-136.
Stam, "Stable Fluids", SIGGRAPH, 121-128.
Steinhoff, et al., "Modification of the Euler equations for Vorticity Confinement: Application to the Computation of Interacting Vortex Rings.", Physics of Fluids 6, 8, 2738-2744.
Takahashi, et al., "Implicit formulation for SPH-based viscous fluids", Comp. Graph. Forum.
Tang, "Moving mesh methods for computational fluid dynamics," Contemporary Mathematics, No. 383, 141-173.
Whitehurst, "A free Lagrange Method for gas dynamics", Mon. Not. Roy. Aston. Soc. 277, 2, 655-680.
Yan, et al., "Computing 2D periodic Centroidal Voronoi tessellation", Int. Symp. on Voronoi Diagrams, 177-184.
Yan, et al., "Efficient computation of clipped Voronoi diagram", Computer-aided design 45, 4, 843-852.
Zheng, et al., "A new incompressibility discretization for a hybrid particle MAC grid representation with surface tension", J. of Comp. Phys. 280, 96-142.
Zhu, et al., "Animating sand as a fluid", ACM Trans. Graph 24, 3, 965-972.
Aubry et al., "Incompressible Lagrangian Fluid Flow with Thermal Coupling", International Center for Numerical Methods in Engineering, Monograph CIMNE N°-95, May 1, 2006, Barcelona, Spain, 170 pages.
Ghasemi et al., "Computational simulation of the interactions between moving rigid bodies and incompressible two-fluid flows", Computers & Fluids, vol. 94, May 1, 2014, pp. 1-13.
Schofield et al., "Multi-material interface reconstruction using particles and power diagrams", Los Alamos National Laboratory, Technical Report LA-UR-06-8740, Dec. 18, 2006, 27 pages.

\* cited by examiner

Power Diagram Process Pseudocode

1: Update velocity $v^*$ via Eq. (8)
2: Compute pressure $p$ via Poisson Eq. (7), or state Eq. (9)
3: Add pressure forces: $v \leftarrow v^* - dt \ \text{diag}(m)^{-1} Gp$
4: For compressible fluids, update volumes $\{\overline{V}_i\}_i$ via Eq. (10)
5: Advect sites: $q \leftarrow b + dt\, v$
6: Enforce volumes $\{\overline{V}_i\}_i$ through weight optimization

*FIG. 11*

PARTICLE-BASED SIMULATION THROUGH POWER DIAGRAMS

CROSS-REFERENCE TO RELATED APPLICATIONS

The present invention claims priority to U.S. Provisional Patent Application Ser. No. 62/147,360 entitled "Particle-based Simulation through Power Diagrams" to Desbrun et al., filed Apr. 14, 2015. The disclosure of U.S. Provisional Patent Application Ser. No. 62/147,360 is herein incorporated by reference in its entirety.

STATEMENT OF FEDERALLY SPONSORED RESEARCH

This invention was made with government support under Grant No. CCF1011944 awarded by the National Science Foundation. The government has certain rights in the invention.

FIELD OF THE INVENTION

The present invention generally relates to fluid simulation and more specifically relates to particle based fluid simulation through power diagrams.

BACKGROUND

Computer graphics or computer generated imagery (CGI) can include still images or movies generated for a computing environment. The resulting still images or movies can be displayed to a user on various display screens, and/or can be used for processing and calculations in the computing environment. Computer graphics can be two dimensional (2D), three dimensional (3D), animated, and/or a combination of 2D, 3D and/or animated graphics.

In a broad sense, computer graphics describes almost everything on a computer that is not text or sound. Many media types utilize computer graphics including animation, movies, advertising, video games, and graphic design. Various computational tools can assist in the calculation and display of computer graphics.

SUMMARY OF THE INVENTION

The use of power diagrams in accordance with embodiments of the invention enable particle based fluid simulation. One embodiment includes a processor, a memory containing a model of a fluid, where the fluid is broken into a set of cells each defining a volume with boundaries that are relative to a distance of a set of points, where the process is configured by the power particle application to: calculate a plurality of forces acting on the set of cells, move the set of cells within the model of the fluid based upon the plurality of forces, and update the model of the fluid with a new set of cells.

In a further embodiment, the plurality of forces further comprises velocity forces.

In another embodiment, the velocity forces are evaluated by the processor using the following expression:

$$\min_{p} \sum_{i} m_i \left\| v_i^* - \frac{dt}{m_i}[Gp]_i \right\|^2$$

where p is a pressure, i is a point in a cell in the set of cells, m is a mass, and G is a gradient operator, and v* is an intermediate velocity.

In a still further embodiment, the plurality of forces further comprises pressure forces.

In still another embodiment, the pressure forces are evaluated by the processor using the following expression:

$$dtLp=Dv^*$$

where L is a discrete Laplacian, p is a pressure force, D is a divergence operator, and v* is an intermediate velocity.

In a yet further embodiment, the pressure forces are external forces.

In yet another embodiment, the pressure forces further comprises gravity.

In a further embodiment again, the forces acting on the set of cells further comprise an object.

In another embodiment again, the object is a static object.

In a further additional embodiment, the object is a dynamic object.

in another additional embodiment, the fluid is an incompressible fluid, and updating the model of the fluid further comprises keeping the volume of the set of cells constant.

In a still yet further embodiment, the fluid is a compressible fluid, and updating the model of the fluid further comprises updating the volume of the set of cells with a local volume change.

In still yet another embodiment, the local volume change is evaluated using the following expression:

$$\overline{V}_i \leftarrow \overline{V}_i + dt[Dv]_i$$

where $\overline{V}$ is a target volume, i is a point in a cell in the set of cells, D is a divergence operator, and v is a velocity force.

In a still further embodiment again, the model of the fluid further comprises multiphase flows.

In still another embodiment again, the model of the fluid further comprises free surfaces surrounded by air cells.

Another further embodiment of the method of the invention includes: the power particle application further comprises a Lagrangian process.

Still another further embodiment of the method of the invention includes: the model of the fluid further comprises a weighted Voronoi diagram.

In a further embodiment, the set of cells are evaluated using the following expression:

$$V_i = \{x \in \Omega \mid \|x-q_i\|^2 - w_i \leq \|x-q_j\|^2 - w_j \forall j\}$$

where V is a cell in the set of cells, $\Omega$ is the fluid model, $q_i$ is a point point in the cell, $q_j$ is a neighboring point in the cell, and w is a weight.

In another embodiment, the model of the fluid is two dimensional.

In a still further embodiment, the model of the fluid is three dimensional.

BRIEF DESCRIPTION OF THE DRAWINGS

FIG. 11 is pseudocode illustrating a process for simulating fluids using power diagrams in accordance with an embodiment of the invention.

DETAILED DESCRIPTION

Figure 1B:
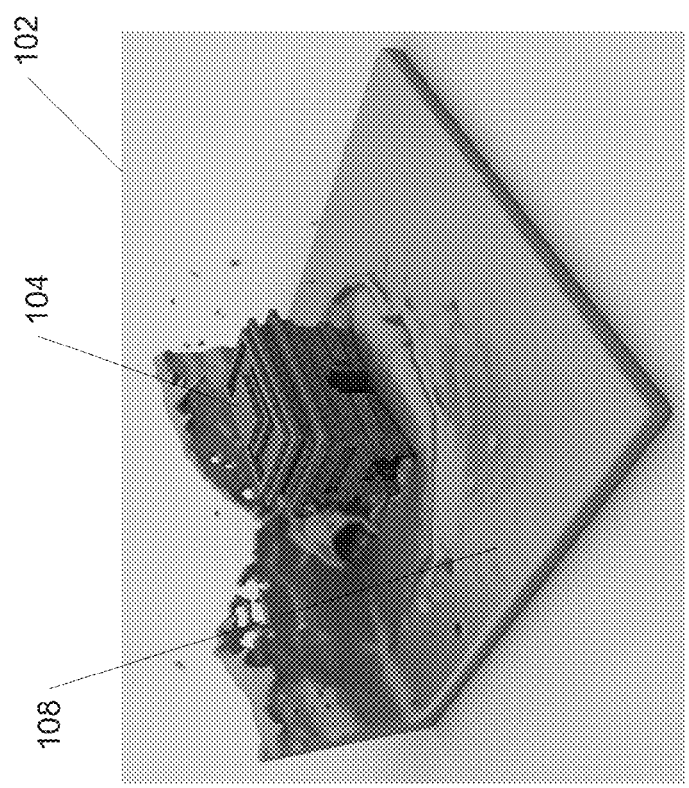
FIGS. 1A and 1B are diagrams conceptually illustrating a simulated moving fluid in accordance with an embodiment of the invention.

Turning now to the drawings, systems and methods for simulating particles through power diagrams in accordance with embodiments of the invention are illustrated. Within the field of computer graphics, fluid simulation (also known as computational fluid dynamics) generates images and/or animations of fluids such as water or smoke. To create a realistic fluid simulation, various physical properties are often simulated such as (but not limited to) viscosity, external forces, gravity, buoyancy, density, velocity, pressure, and/or advection. Fluids are typically compressible or incompressible. Compressible fluids can change density. Incompressible fluids on the other hand, typically have a constant density. Intricate patterns within a fluid such as vortices in liquids and/or volutes in smoke are often visual cues of incompressible flows. Various approaches including Lagrangian methods can be utilized to simulate fluid motion.

Various Lagrangian approaches can be utilized to simulate fluids including (but not limited to) smoothed particle hydrodynamics (SPH), density constrained SPH, divergence free SPH, hybrid schemes, moving mesh approaches, and/or Voronoi based methods. SPH discretizes fluids as material points with interaction forces derived from smooth kernel functions. Early SPH approaches have remained largely constrained to compressible fluid cases. However, SPH based approaches have been extended in a number of ways including through density-constrained SPH which can control particle density throughout a simulation. While density-constrained SPH approaches retain evenly spaced particle distributions over time, the iterative computations of pressure forces induced by intermediate density fluctuations can introduce severe numerical damping. Alternatively, divergence-free SPH approaches can address fluid incompressibility by moving particles along a divergence-free velocity field. Hybrid approaches couple non-diffuse Lagrangian advection with accurate Eulerian pressure projection on an auxiliary grid to partially remedy inherent issues with SPH methods. Fluid solvers have also been proposed that utilize moving mesh techniques. While moving mesh techniques are partially Lagrangian and leverage accurate pressure projection on meshes, they require a large amount of mesh updates which can make them less practical and robust than particle based approaches. Voronoi based methods generally utilize Voronoi cells (a partitioning of the fluid undo regions based on distance to specific points in a subset of the fluid) which can move based on fluid motion. After cells have moved, they can be remapped using Eulerian remapping.

Systems and methods in accordance with many embodiments of the present invention perform fluid simulation using power diagram techniques. Power diagram processes utilize Voronoi diagrams that incorporate extra degrees of freedom to partition the fluid domain. The term Voronoi diagram is used to describe a diagram that partitions a plane or a volume using a representation that specifies the partitions based upon distances to specific set of points, which are often referred to as sites. In this way, polyhedral volumes within a fluid can be simulated by power cells, and a power diagram comprises one or more power cells. In many embodiments, power diagrams can be weighted Voronoi diagrams (where cells in a Voronoi diagram have a weight of zero). As is discussed further below, power cells (i.e. representation of small volumes as distances from points) can provide significant coputational advantages in the simulation of different types of fluids. Additional variables in power particles offer increased control over the volume of the fluid cells, which typically results in evenly spaced particles over time. The velocities within the power diagram domain can be updated over time as power cells move within the simulated fluid. External forces and/or internal forces (such as viscosity) can be simulated with power diagrams. In various embodiments, power diagram processes update the velocity of individual power cells, calculate the pressure and combine this pressure with the velocity calculations. The volumes of the fluid can be enforced via weight optimization. Following the velocity update, the fluid volume can be repartitioned into a new set of power cells in preparation for the next iteration of the simulation. In many embodiments, the repartitioning process involves preserving the volumes of the particles following partitioning but redefining the shapes of the particles. In this way the particles have shapes and adjacency (i.e. the particles to which they adjacent) that change as the simulation progresses. The power diagram process can be adapted for different types of fluid as described below. As can readily be appreciated, the specific velocity updates and repartitioning steps utilized in a fluid simulation typically depends upon the requirements of a given application in accordance with embodiments of the invention.

Incompressible, compressible, and/or multiphase flows (i.e. multiple fluid types interacting within the same domain) can be simulated using power diagrams techniques in accordance with various embodiments of the invention. Additionally in some embodiments, fluid interaction with air can be simulated. Typically, this is simulated utilizing a layer of ghost particles, or a band of air particles around the fluid. In various embodiments, power diagrams can simulate fluid interaction with obstacles including (but not limited to) a variety of stationary (or static) objects including (but not limited to) buildings, archways, and/or statues. Physical objects can also include moving objects (or dynamic objects) which cause additional motion in the fluid such as (but not limited to) a boat, a paddle, various marine life, and/or people swimming. Additionally, power diagrams can simulate two-dimensional or three-dimensional fluids. In many embodiments, surface tension can be simulated using power diagrams. Fluid simulations in accordance with various embodiments of the invention are discussed below.

Simulating a Fluid

Figure 1A:
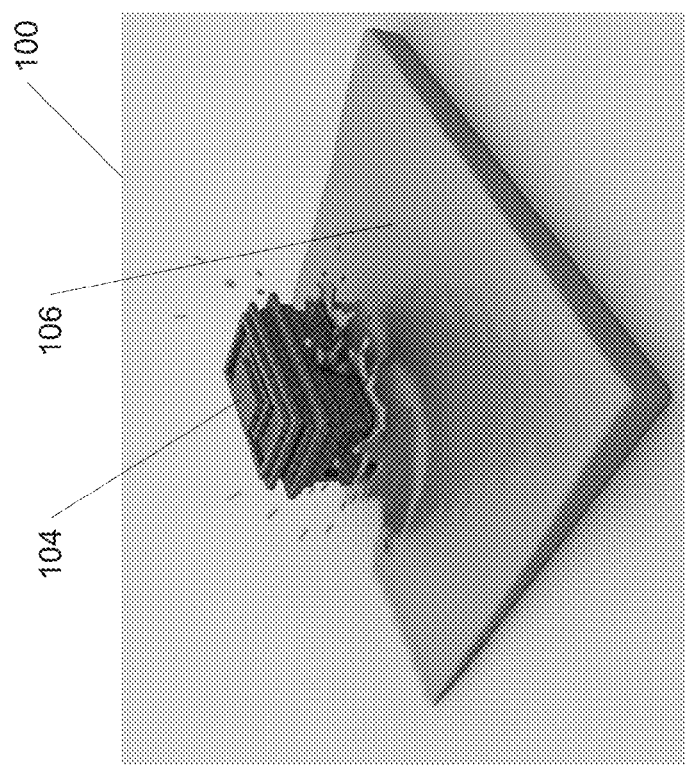

Simulating a moving fluid is conceptually illustrated in FIGS. 1A and 1B. An image 100 of a scene of moving fluid at a first time is illustrated in FIG. 1A. Image 100 contains a moving fluid at a first time 106 which can be seen hitting a physical object 104. Physical objects can include a variety of stationary objects including (but not limited to) buildings, archways, and/or statues. Physical objects can also include moving objects which cause additional motion in the fluid such as (but not limited to) a boat, a paddle, various marine life, and/or people swimming. In many embodiments, several fluids with different properties can interact. Fluid properties can include (but are not limited to) volume, density, initial velocities, viscosity, compressibility, incompressibility, other external forces, and/or surface tension.

Figure 2:
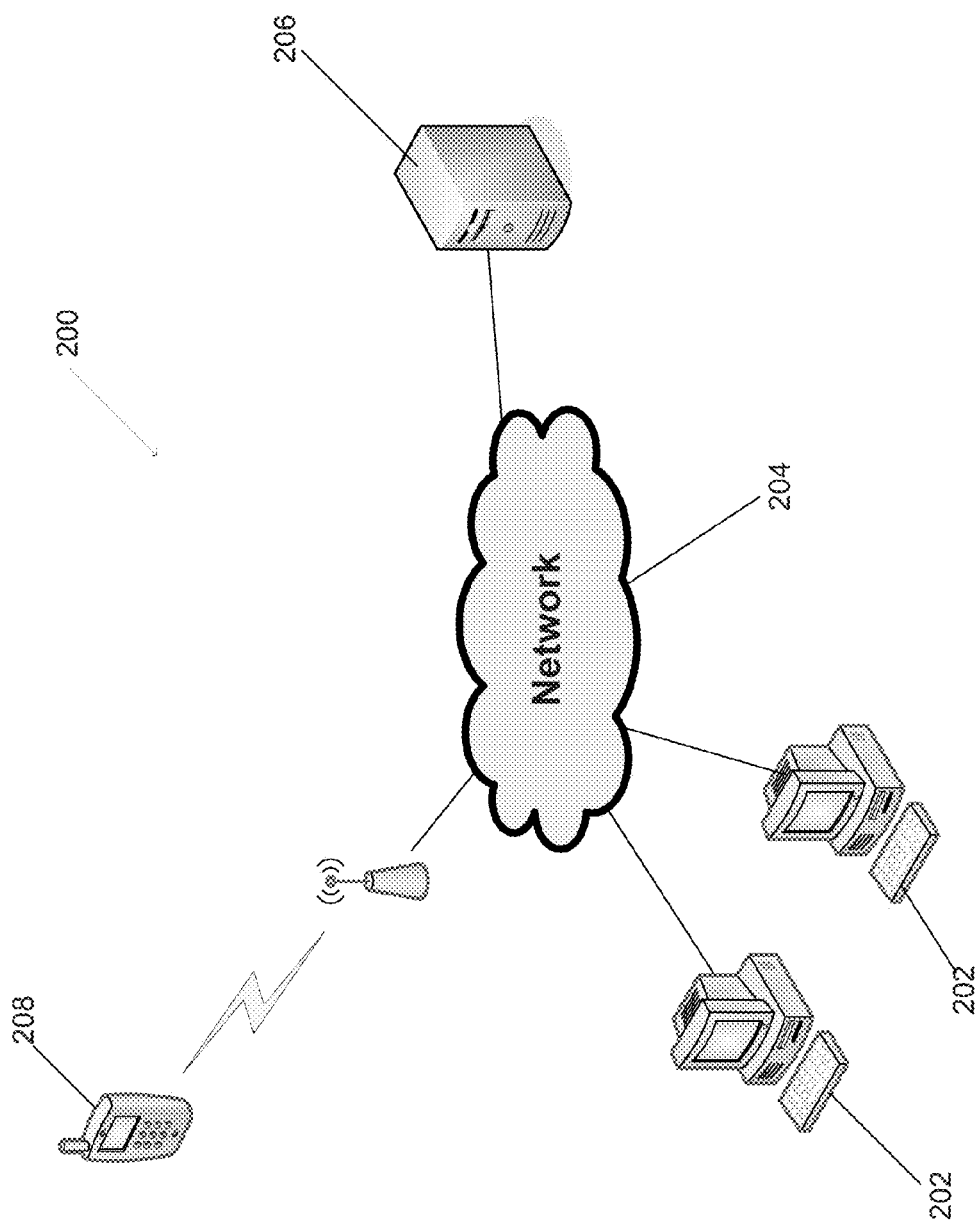
FIG. 2 is a diagram conceptually illustrating a fluid simulating architecture in accordance with an embodiment of the invention.

The same scene of moving fluid captured at a second time is illustrated in FIG. 1B. An image 102 contains the same physical object 104. The fluid at a second time 108 can be seen moving and changing shape as it interacts with the physical object. In various embodiments, the fluid can be in an empty space. In many embodiments, the fluid can interact with the sides of the environment. Before discussing the specifics of the process utilized to simulate fluids with power diagrams, we provide an overview of the computing platform and software architectures that can he utilized to implement fluid simulation in accordance with various embodiments of the invention. Although a number of different of processess for performing fluid simulations are described above with respect to FIGS. 1A-1B, any of a variety of fluids interacting in different situations can he simulated as appropriate to the requirements of specific applications in accordance with various embodiments of the invention. Fluid simulating architectures, including software architectures that can be utilized to generate computer graphics ona a computing systerm are discussed further Fluid Simulating Architectures A fluid simulating architecture that can be utilized in the calculation and display of graphical images can be seen conceptually illustrated in FIG. 1 Computers with a display 202 can perform the necessary calculations associated with the genreation of computer animations that simulate fluid dynamics and/or can connect to network 204 using a wired and/or wireless connection. Additionally, in many embodiments a database management system 210 can be connected to network 204 to store rendered graphics for display on remote devices. In some embodiments, a remote device 208 can display graphics stored internally and/or hosted on a database system. In other embodiments, a remote device 208 can itself perform calculations for the display of graphical images. Remote devices can include (but are not limited to) cellular telephones, tablet computers, and/or a variety of consumer electronics capable of displaying a graphic image. In various embodiments, fluid simulating architectures utilize power diagrams as described below with reference to FIGS. 4A, 4B, and 5. Although a number of different fluid simulating architectures are described above with respect to FIG. 2, any of a variety of computing architectures can be utilized as appropriate to the requirements of specific applications in accordance with many embodiments of the invention. Object simulating controllers that are utilized to generate graphical simulations of a fluid in accordance with various embodiments of the invention are discussed below.

Object Simulating Controllers

Figure 3:
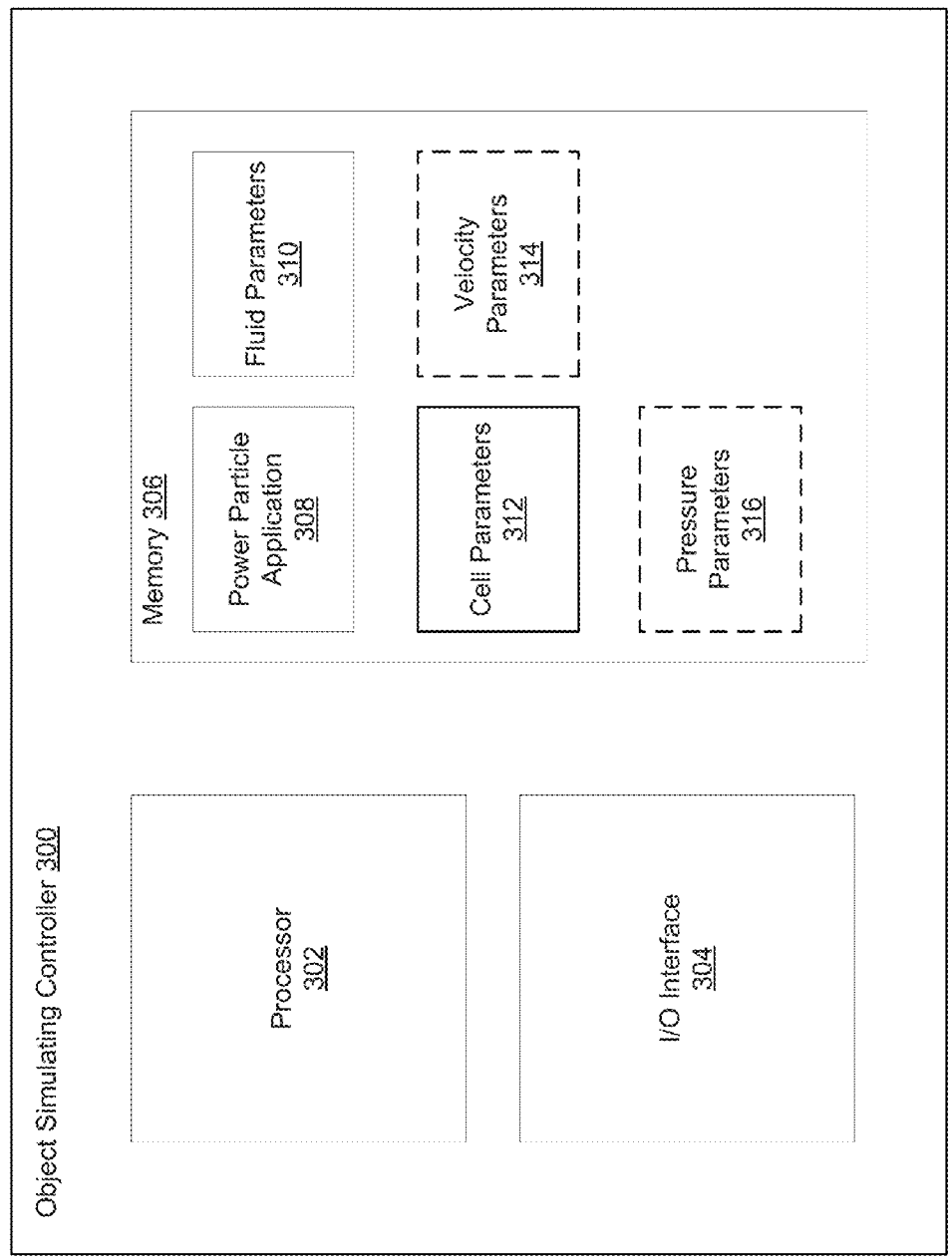
FIG. 3 is a block diagram illustrating an object simulating controller in accordance with an embodiment of the invention.

An object simulating controller in accordance with an embodiment of the invention is shown in FIG. 3. In various embodiments, object modeling controller 300 can perform calculations necessary to generate a graphical simulation of a fluid. In various embodiments, the graphical model can be a video. Fluids can be simulated in a variety of domains. In some embodiments, a fluid can move in an empty space. In other embodiments, the fluid comes into contact with physical objects which can change the movement of the fluid and/or can be simulated in containers of varying shapes. These physical objects can be stationary and/or can move themselves. An illustration of an embodiment of fluid interacting with a stationary object is conceptually illustrated above in FIG. 1A and FIG. 1B.

The object simulating controller includes at least one processor 302, an I/O interface 304, and memory 306. The at least one processor 302, when configured by software stored in memory, can perform calculations on and make changes to data passed through the I/O interface as well as data stored in memory. In many embodiments, the memory 306 includes software including a power particle application 308, as well as a variety of parameters including (but not limited to) fluid parameters 310, cell parameters 312, velocity parameters 314, and/or pressure parameters 316. The object simulating controller can utilize power diagrams to simulate the movement of fluid as described in detail further below. The power particle application 308 will also be discussed in greater detail below and can enable a computing system to perform calculations to solve for updated power cell parameters within a power diagram.

Although a number of different object simulating controllers are described above with respect to FIG. 3, any of a variety of computing systems capable of performing fluid simulation can be utilized as appropriate to the requirements of specific applications in accordance with various embodiments of the invention. Power diagrams and power cells in accordance with many embodiments of the invention will now be discussed in greater detail.

Power Diagrams

Figures 4A, 4B:
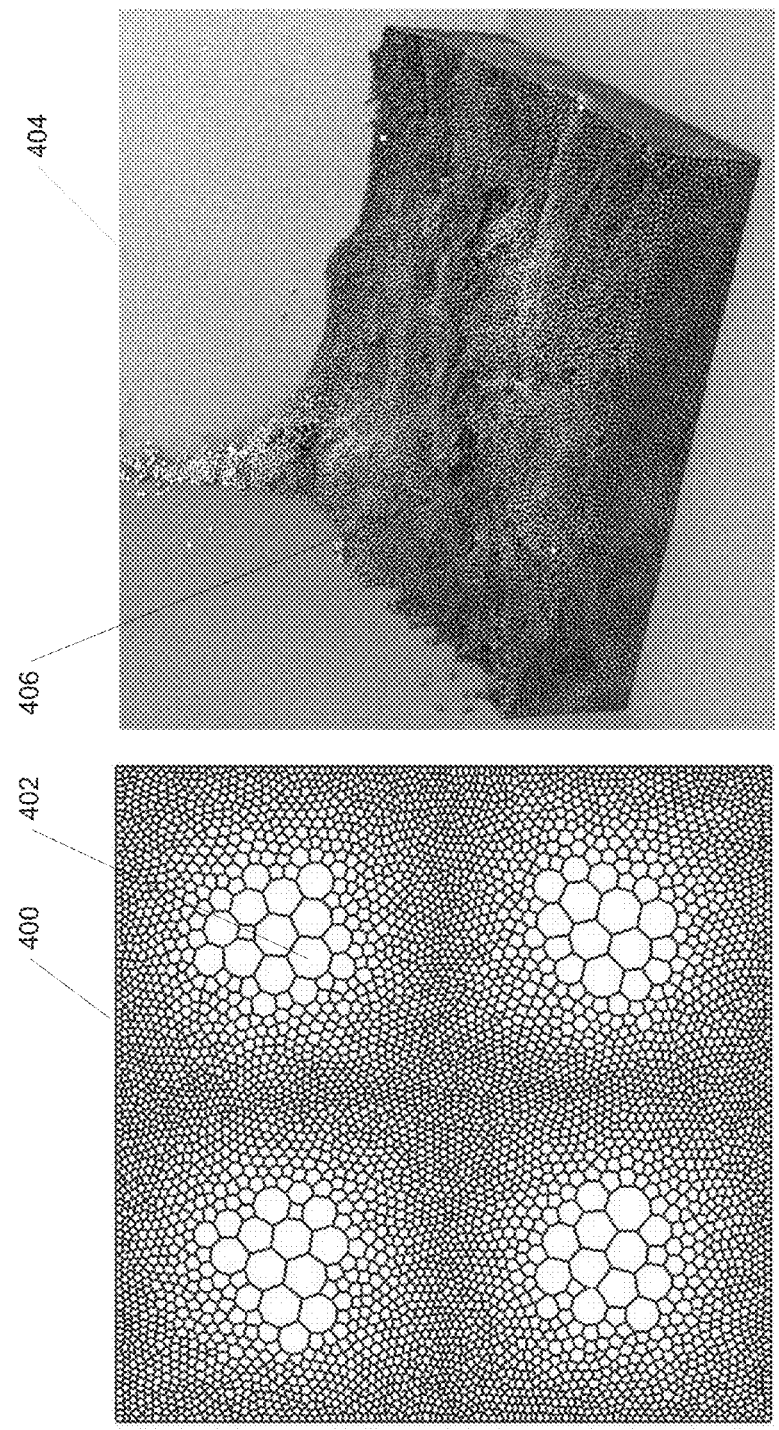
FIGS. 4A and 4B are diagrams illustrating two dimensional and three dimensional power diagrams respectively, in accordance with an embodiment of the invention.

A Lagrangian method for fluid simulation can be based on power diagrams. Two dimensional and three dimensional power diagrams are illustrated in FIGS. 4A and 4B respectively. An image 400 of a two dimensional power diagram is illustrated in FIG. 4A. Image 400 comprises one or more two dimensional cells 402. In many embodiments, these cells can he various sizes depending on cell parameters. An image 404 of a three dimensional power diagram is illustrated in FIG. 4B. This image comprises three dimensional power cells 406. Individual power cells that can be utilized in power diagrams are discussed in more detail below with respect to FIG. 5.

In several embodiments power diagrams are a generalization of Voronoi diagrams that incorporates extra degrees of freedom to partition the domain occupied by the fluid. Power diagrams allow discretization of fluids as volumetric parcels formed by cells of a power diagram that determine, at each time step, a well-shaped mesh from which accurate discrete differential operators are derived. The additional variables afforded by a power diagram also offer complete control over the volume of each fluid cell, resulting in evenly spaced particles over time. In many embodiments, additional variables afforded by a power diagram also offer complete control over the volume of each fluid cell, resulting in evenly spaced particles over time. The enforcement of incompressibility is thus achieved both geometrically (through precise density control) and dynamically (via accurate projection onto divergence-free velocities).

In many embodiments, power diagram processes remain purely Lagrangian, which do not suffer from significant numerical diffusion or mass fluctuations as commonly seen in Eulerian processes. In many embodiments, power diagram processes can be entirely devoid of error-prone, kernel-based estimation of pressure, force, or density. Power cells and how they can make up a power diagram are described in detail below.

Power Cells

Figure 5:
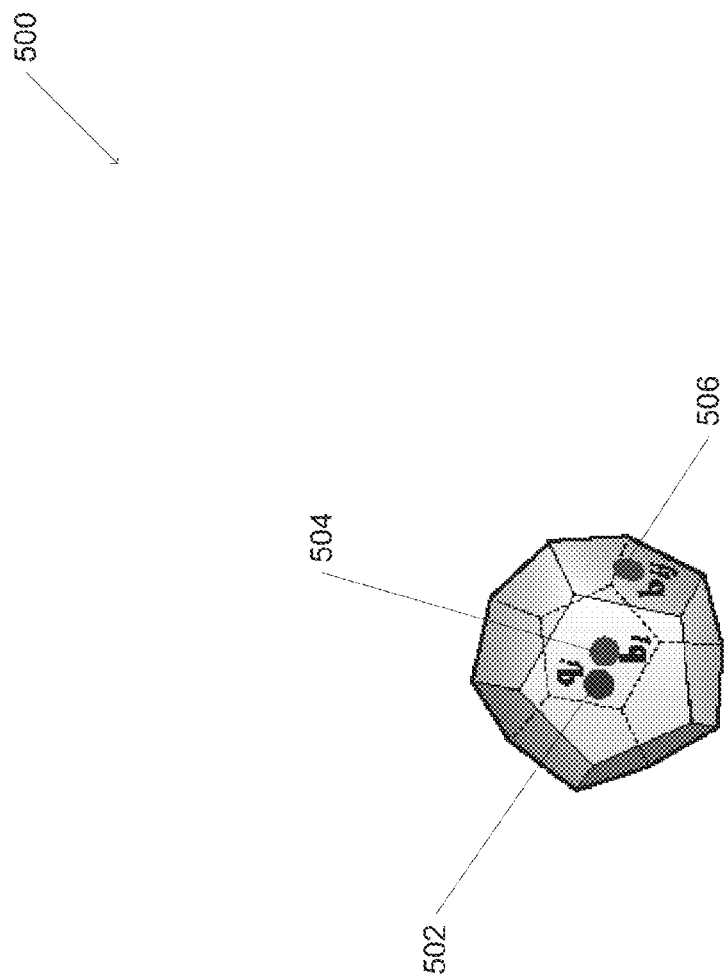
FIG. 5 is a diagram illustrating an individual power cell that can be used in a power diagram in accordance with an embodiment of the invention.

Power cells for fluid discretization are illustrated in FIG. 5. A fluid domain $\Omega$ typically has volume $|\Omega|$ and boundary $\partial\Omega$. In various embodiments, power diagram (as illustrated in FIGS. 4A and 4B above) is a partitioning of $\Omega$ into a cell complex defined by a list of n points $\{q_i\}_i$, called sites, and their associated scalar values $\{w_i\}$, called weights. For each weighted point $(q_i, w_i)$ 500, its power cell $V_i$ is defined as $$V_i = \{x \in \Omega \mid \|x-q_i\|^2 - w_i \leq \|x-q_j\|^2 - w_j \forall j\}, \quad (1)$$

where $\|\cdot\|$ indicates the Euclidean norm.

In many embodiments, two sites $q_j$ 502 and $q_j$ are said to he neighbors if the intersection $V_i \cap V_j$ is a non-empty power facet $A_{ij}$ of codimension 1, corresponding to a planar polygon in three dimensions and a line segment in two dimensions. The set of neighboring sites sharing a power facet with site i are indicated by and $N_i$, and $l_{ij}$ can be used to indicate the distance $\|q_i - q_j\|$. In several embodiments $d_{ij}$ can denote the distance from $q_i$ 502 to $A_{ij}$ so that $d_{ij} + d_{ji} = l_{ij}$. The centroid (i.e., center of mass) of cell $V_i$ can be indicated by $b_i$ 504, while the centroid of power facet $A_{ij}$ is denoted as $b_{ij}$ 506. Additionally $V_i$ can be the volume in three dimensions (or respectively the area in two dimensions) of and $A_{ij}$ as the area in three dimensions (or respectively the length in two dimensions) of $A_{ij}$. In various embodiments, when weights are all equal, power diagrams reduce to Voronoi diagrams.

As for the Voronoi-Delaunay pair, a power diagram also defines by duality a triangulation of the sites (known as the weighted Delaunay triangulation), in which each neighboring pair of sites forms an edge that is orthogonal to its associated power facet. Furthermore, the weighted circumcenters of the tetrahedra of this triangulation in three dimensions (or respectively triangles in two dimensions) correspond to dual vertices of the power diagram, i.e., they are at the intersection of four power cells in three dimensions (or respectively three in two dimensions). Although power diagrams have found many applications in geometry processing, their use in simulation has previously been restricted to the formation of bubbles and foams.

Robust construction of power diagrams is best left to one of the several existing libraries which return, from a series of sites and weights, a geometric description of the power cells and their power facets, as well as iterators encoding cell connectivity. Power cells that intersect the boundary $\partial\Omega$ can be further clipped either using the Sutherland-Hodgman processes, or based on mirrored copies of the subset of sites with dual facets straddling in several embodiments, if the domain $\Omega$ is periodic, a similar mirroring procedure can also be used. The resulting clipped cells form finite (and possibly non-convex) polytopes, from which one can compute gill relevant geometric quantities (centroids $b_i$ and $b_{ij}$, volumes $V_i$, areas $A_{ij}$, and lengths $l_{ij}$). While the worst-case computational cost to construct power diagrams in three dimensions is quadratic in the number of sites, the average-case scenario is linear in the number of sites.

Although a variety of power diagrams and power cells are described above with respect to FIGS. 4A, 4B, and 5, any of a variety of processes capable of partitioning a fluid for simulation can be utilized as appropriate to the requirements of specific applications in accordance with various embodiments of the invention. Processes for fluid simulation through power diagrams in accordance with various embodiments of the invention will now be discussed in detail below.

Volume Constraints

In several embodiments, in addition to defining connectivity, the weights of a power diagram offer full control over cell volumes. It has been proved that for a set of sites $\{q_i\}_i$ and a target volume $\overline{V}_i$ for each of them, a power diagram satisfying $V_i = \overline{V}_i$ can be uniquely constructed by solving for weights that maximize a concave energy $$\mathcal{E}(\{w_i\}_i) = \sum_i \int_{V_i} \|x - q_i\|^2 dx - \sum_i w_i (V_i - \overline{V}_i). \quad (2)$$

It is worth pointing out that the energy $\varepsilon$ is smooth, even through local connectivity changes; this implies that even if the weighted Delaunay triangulation changes discretely over time through flips, its dual power diagram is evolving continuously.

It can be shown that this weight optimization is equivalent to an optimal transport problem with volume constraints, and that the Hessian of $\varepsilon$ has a simple, closed-form expression. Optimal weights for a given set of cell volumes are thus efficiently found by iteratively updating them through Newton's steps of the form $$\frac{1}{2}\Delta\delta w = V - \overline{V}, \quad (3)$$

where $\Delta$ is the usual finite-volume Laplacian matrix built from the facets of the power diagram, with entries $\Delta_{ij}=A_{ij}/l_{ij}$. Notice that, as power facets always have positive area (or respectively length in two dimensions), the Laplacian is negative semi-definite, with linear functions in its kernel. This weight optimization will be described further below as a means to preserve local volumes (and thereby densities, since each particle will have a fixed mass) in a fluid process.

Discrete Operators

In several embodiments, power diagram processes naturally lead to discrete operators on scalar and vector fields stored on power cells that mimic their continuous counterparts, which can be useful in enforcing divergence-free velocity fields. Since motion of volume per particle (namely, $V_i$) can be well defined, the notion of divergence can be measured by how the local volume is affected by the motion of the sites with fixed weights. In several embodiments, the discrete divergence operator D can he defined as the volume rate of change induced by displacing sites, i.e., $D=\nabla_q V$. For n particles in a d-dimensional domain this operator corresponds to an n×n matrix with row-valued entries:

$$\begin{cases} D_{ij} := (\nabla_{q_j} V_i)^t = \frac{A_{ij}}{l_{ij}}(q_j - b_{ij})^t, \\ D_{ii} := (\nabla_{q_i} V_i)^t = -\sum (\nabla_{q_i} V_j)^t. \end{cases} \quad (4)$$

In many embodiments, the corresponding gradient is obtained through Stokes' theorem:

$$\int_\Omega \bar{V}p \cdot v dx + \int_\Omega p\bar{V} \cdot v dx = \int_{\partial\Omega} p(v \cdot n) dx, \quad (5)$$

Where p is a scalar function and v is a vector field.

Several embodiments can assume Neumann boundary conditions (boundary conditions will be discussed in more detail below), where the gradient operator G is defined as the negated transpose of the divergence operator. i.e., $G=-D^t$. For a discrete function with values $\{p_i\}_i$, our gradient then reduces to:

$$[Gp]_i = \sum (D_{ji})^t(p_i - p_j) = \sum \frac{A_{ij}}{l_{ij}}(q_i - b_{ij})(p_i - p_j).$$

It bears pointing out that this discrete gradient is symmetric (i.e., gradient forces from particle i to j cancel forces from j to i) and, as such, exactly preserves linear momentum. It should be noted, this is in sharp contrast to the SPH methodology, where the kernel-based gradient needs to be systematically symmetrized. Angular momentum is also preserved due to the invariance of the volume of power cells to global rotations. Furthermore, since this definition is directly derived from a consistent partition of the domain into local volumes exactly summing up to the total volume $|\Omega|$, a process in accordance with an embodiment of the invention does not suffer the usual inaccuracies of kernel-based operators: the gradient operator is exact for linear functions, while the symmetrized gradient operator used in SPH methods fails to be accurate even on constant fields. Additionally, the approximation error of the operators on arbitrary functions are further minimized when sites $\{q_i\}_i$ of the power diagram coincide with their respective centroids $\{b_i\}_i$, that is, for centroidal power diagrams.

Power Diagram Processes

Figure 6:
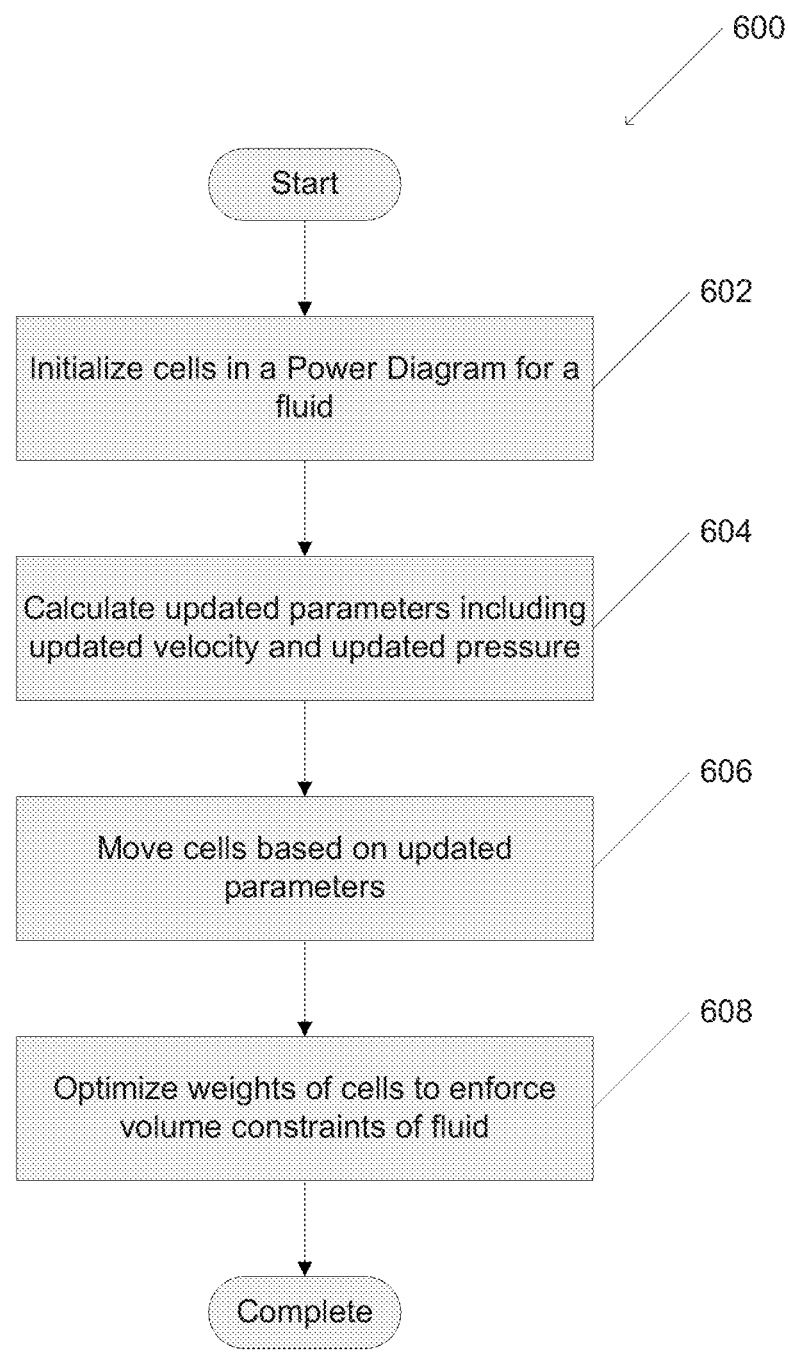
FIG. 6 is a flow chart illustrating a process to simulate a fluid using power diagrams in accordance with an embodiment of the invention.

Processes for simulating fluids using power diagrams in accordance with various embodiments of the invention are illustrated in FIG. 6. The process 600 includes initializing 602 power cells for a fluid domain in a power diagram. Power cells can be two dimensional, three dimensional or a mix of two and three dimensional according to embodiments of the invention. Updated parameters are calculated 604 including (but not limited to) updated fluid velocity and updated fluid pressure. In many embodiments, the fluid can be (but is not limited to) an incompressible fluid, a compressible fluid, and/or a multiphase fluid. In several embodiments, parameters for an incompressible, fluid can be updated utilizing a process similar to the process for updating parameters in incompressible fluids in power diagrams as described below with respect to FIG. 7. In many other embodiments, parameters for a compressible fluid can be updated utilizing a process similar to the process for updating compressible fluids in power diagrams as described below with respect to FIG. 8. Power diagram processes can simulate a fluid in a manner similar to pseudocode for power diagram fluid simulation as described below with respect to FIG. 11.

Power cells move 606 based on the updated parameters. In various embodiments, this movement can simulate the movement of the fluid over time. Weights of the power cells are optimized 608 to enforce fluid volume constrains. In some embodiments, power diagrams can simulate a fluid in a manner similar to pseudocode for a process for fluid simulation as described below with respect to FIG. 11 below. Although a variety of processes utilizing power diagrams are described above with respect to FIG. 6, any of a variety of processes capable of simulating fluids can be utilized as appropriate to the requirements of specific applications in accordance with various embodiments of the invention. Processes for updating parameters while simulating incompressible fluids in accordance with many embodiments are discussed below.

Processes for Updating Incompressible Fluid Parameters

Figure 7:
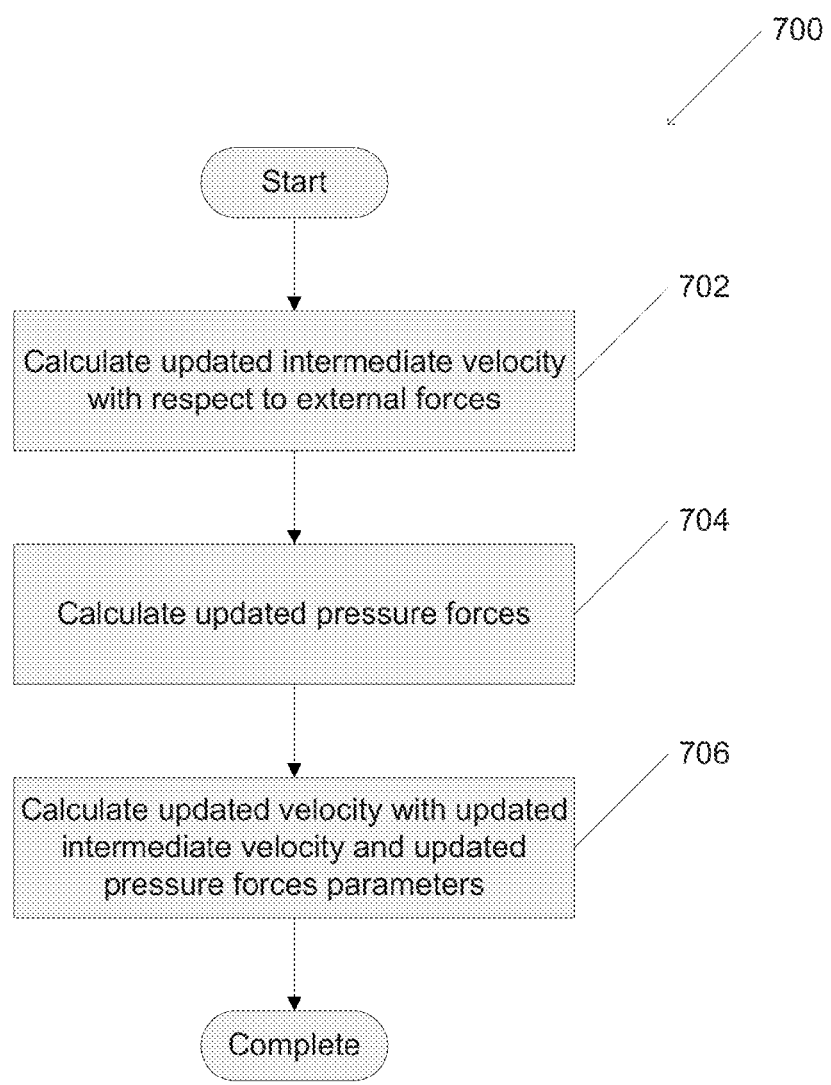
FIG. 7 is a flow chart illustrating a process to update parameters in an incompressible fluid using power diagrams in accordance with an embodiment of the invention.

Processes for updating incompressible fluids using power diagrams in accordance with a number of embodiments of the invention are illustrated in FIG. 7. In many embodiments, this process can be utilized in a power diagram simulation process similar to step 604 as described above with respect to FIG. 6. The process 700 includes calculating 702 an updated intermediate velocity parameter with respect to external forces. Each power particle through an explicit time integration can be based on external forces such as (but not limited to) gravity and/or buoyancy. Updated pressure forces are calculated 704. An updated velocity is calculated 706 using the updated intermediate velocity and pressure forces parameters. In several embodiments, power diagrams can simulate an incompressible fluid in a manner similar to pseudocode for a process for fluid simulation as described below with respect to FIG. 11. Processes for updating parameters while simulating compressible fluids in accordance with several embodiments of the invention are described below.

Processes for Updating Compressible Fluid Parameters

Figure 8:
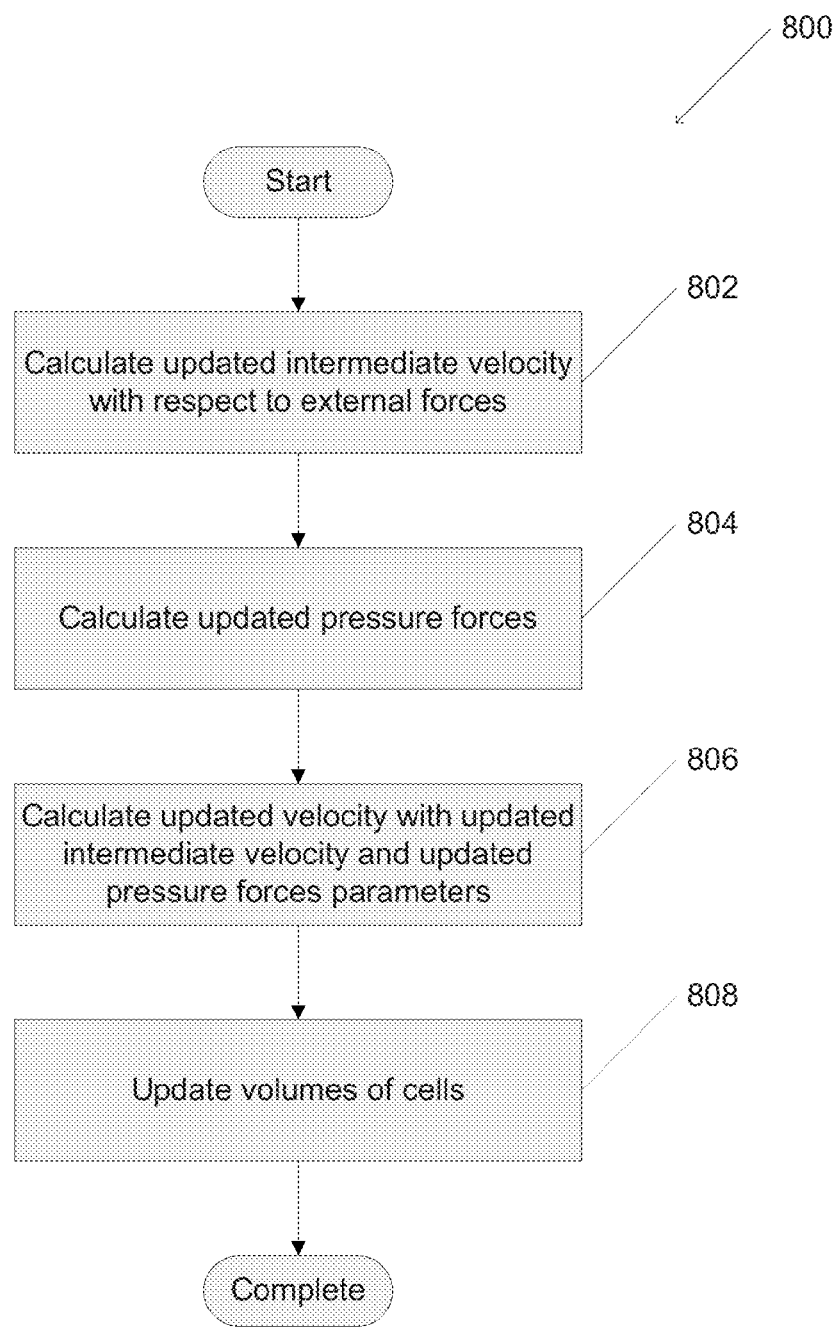
FIG. 8 is a flow chart illustrating a process to update parameters in a compressible fluid using power diagrams in accordance with an embodiment of the invention.

Processes for updating compressible fluids utilizing power diagrams in accordance with several embodiments of the invention are illustrated in FIG. 8. In several embodiments, this process can be utilized in a power diagram simulation process similar to step 604 as described above with respect to FIG. 6. The process 800 includes calculating 802 an updated intermediate velocity with respect to external forces. An updated pressure force is calculated 804. An updated velocity parameter is calculated 806 utilizing parameters including the updated intermediate velocity and updated pressure forces parameters. The volumes of the cells in the power diagram are updated 808. In many embodiments, updating the volumes of the cells is necessary do the nature of compressible fluids, i.e. the volume of the fluid can change over time and thus the volumes of the cells can change over time.

Although a variety of processes for simulating fluids utilizing power diagrams are described above with respect to FIGS. 6, 7 and 8, any of a variety of processes capable of performing fluid simulation can be utilized as appropriate to the requirements of specific applications in accordance with various embodiments of the invention.

In several embodiments, Lagrangian approaches for incompressible fluid simulation use time-evolving material points that interact via pressure forces. Whether these forces are computed through error-prone kernel evaluations as in SPH methods or through an auxiliary grid as in FLIP schemes, numerical dissipation and particle drifting tend to plague the visual liveliness of such particle methods. Moving meshes and ALE methods provide an alternative by carrying an adaptive mesh along with the material points to combine non-diffusive Lagrangian advection and accurate Eulerian pressure estimates; however, connectivity updates required to resolve mesh entanglement introduce resampling error, often in the form of numerical viscosity. In may instances, the result can appear as a fluid that loses velocity rapidly and in an unrealistic manner.

In an embodiment of the present invention, fluid particles can be discretized as volumetric parcels described by cells of a time-evolving power diagram (hence, the name power particles). Various processes similar to fluid power diagram processes described above with respect to FIGS. 6, 7, and 8 can add to the usual set of sites $\{q_i\}_i$ used in material point discretizations a new set of dynamical variables represented by time varying weights $\{w_i\}_i$. The power diagram determined by both sites and weights then defines the geometry of the fluid parcels. Thus, these power particles combine the simplicity of Lagrangian methods with the accuracy of mesh-based approaches. In particular, various computational tools can be leveraged to deform power diagrams based on the dynamics of incompressible fluids, while retaining well-shaped, volume-constrained cells.

Starting from a cells of volume $\{\bar{V}_i\}_i$ and fixed mass $\{m_i\}_i$, the motion of power particles is updated at each time step in two stages: a velocity update followed by a cell advection. The former is based on a linear-accurate projection method to enforce zero divergence of the velocity field $\{v_i\}_i$, while the latter advects cells in time by updating the sites $\{q_i\}_i$ based on the current cell centroids and velocities before optimizing the weights $\{w_i\}_i$ to determine spatial occupancy. Since the volume of each power particle is precisely controlled, so is the local density since the mass of each particle is fixed in time. In several embodiments, this approach can handle arbitrary large deformations while achieving accurate pressure forces and evenly spaced particles as demonstrated below.

Velocity Updates

In several embodiments of the invention, the velocity update begins by doing an explicit time integration of the external forces followed (if needed) by an implicit integration of viscosity forces, leading to an intermediate velocity $v_i^*$ for each particle i. To enforce incompressibility instantaneously, pressure forces that project velocities to a zero divergence field are computed. The discrete operators described above are leveraged to solve for pressure values $\{p_i\}_i$ by minimizing the change in kinetic energy necessary to reach a divergence-free vector field, i.e.:

$$\min_p \sum_i m_i \left\| v_i^* - \frac{dt}{m_i}[Gp]_i \right\|^2. \quad (6)$$

In many embodiments, the discrete Poisson equation for pressure is thus:

$$dtLp = Dv^*, \quad (7)$$

where $L = D\text{diag}(m)^{-1}G$ is the discrete Laplacian with diag (m) as the diagonal matrix containing every particle mass. The velocity field v is then updated by subtracting dt diag(m)$^{-1}$Gp from v*, rendering the final velocity divergence-free. Note that our Laplace operator L is, by construction, negative semi-definite with linear functions in its kernel. It should be noted that L has a two-away stencil, in contrast to the finite-volume Laplacian $\Delta$ introduced above with a one-ring stencil that acts on weights. Both operators approximate the same continuous operator, but play very different roles in a discrete setting of an embodiment of the invention. Cell advection will be described below.

Cell Advection

In several embodiments, after updating velocities, the time the volumetric fluid parcels represented by power particles can be advanced. Advection can he achieved by computing new sites $\{q_i\}_i$ and weights $\{w_i\}_i$ evolve the power diagram while controlling the spacing and volumes of the new cells. To this end, the sites $\{q_i\}_i$ are explicitly updated to the positions of their respective centroids $\{b_i\}_i$ once advected along velocities $\{v_i\}_i$, i.e., $q_i = b_i + dtv_i$. With these new sites, we then make use of the concave optimization in and solve for new weights $\{w_i\}_i$ so that the volume $V_i$ of each cell equates its target volume $\bar{V}_i$. Note that if the target volumes remain constant in time, then this enforcement of local volumes implies exact preservation of fluid densities (hence, incompressibility) since each particle mass is constant. Target volumes can also he determined via a state equation in the case of compressible fluids Also, observe that the use of centroids favors evenly spaced distributions, and thus improves the accuracy of our discrete operators as described above. Moreover, the weight update controls the relative sizing among particles, reducing artificial particle smoothing and velocity damping that can be ubiquitous in existing Lagrangian methods. Finally, we point out that updating sites and weights also adapts the connectivity of the power diagram directly and continuously, eliminating the risk of mesh entanglement that moving mesh methods typically face.

While the discretization of fluid flows in some embodiments contains only one additional variable per particle compared to typical Lagrangian methods, the consequences of this added degree of freedom are manifold. First, it induces a tiling of the fluid as each particle is now associated with a spatial cell of controllable volume. Second, the geometric definition of these cells allows us to derive consistent discrete differential operators (divergence, gradient, and Laplacian) based on the analytical expression of their volumes. Note that these operators are, in fact, extensions of the ones derived for Voronoi diagrams in, and thus share their properties of being linear accurate and matching to first order their Eulerian counterparts. The accuracy of these operators combined with our pressure projection thus leads to a time integrator with low numerical dissipation. Furthermore, our Lagrangian cell advection via centroids maintains well-centered power cells in time; as power particles come to rest, in various embodiments they actually form a blue noise distribution. As described below, these benefits keep at bay the usual issues of density fluctuations, spurious pressure modes, and excessive artificial viscosity. It also entirely sidesteps the problem of mesh tangling in moving mesh methods. Finally, Voronoi-based approaches such as simply cannot control the volume of their cells and thus require mesh regularization to bound volume drift, while our weights determine volume (and thus density) exactly.

Pseudocode for Power Diagram Processes

Turning now to FIG. 11, fluid solver based on power particles in accordance with an embodiment of he invention is described in pseudocode form. Incompressible power particles, are described, and then simple modifications to turn the process into a compressible and multiphase fluid solver are illustrated. In many embodiments, extensions of the process can be utilized to incorporate free surfaces, surface tension, moving obstacles, and viscosity which will be described further below. Pseudocode, that can simulate fluids utilizing power diagrams is illustrated in FIG. 11. Details of implementations of processes described by this pseudocode are described below.

Figure 10:
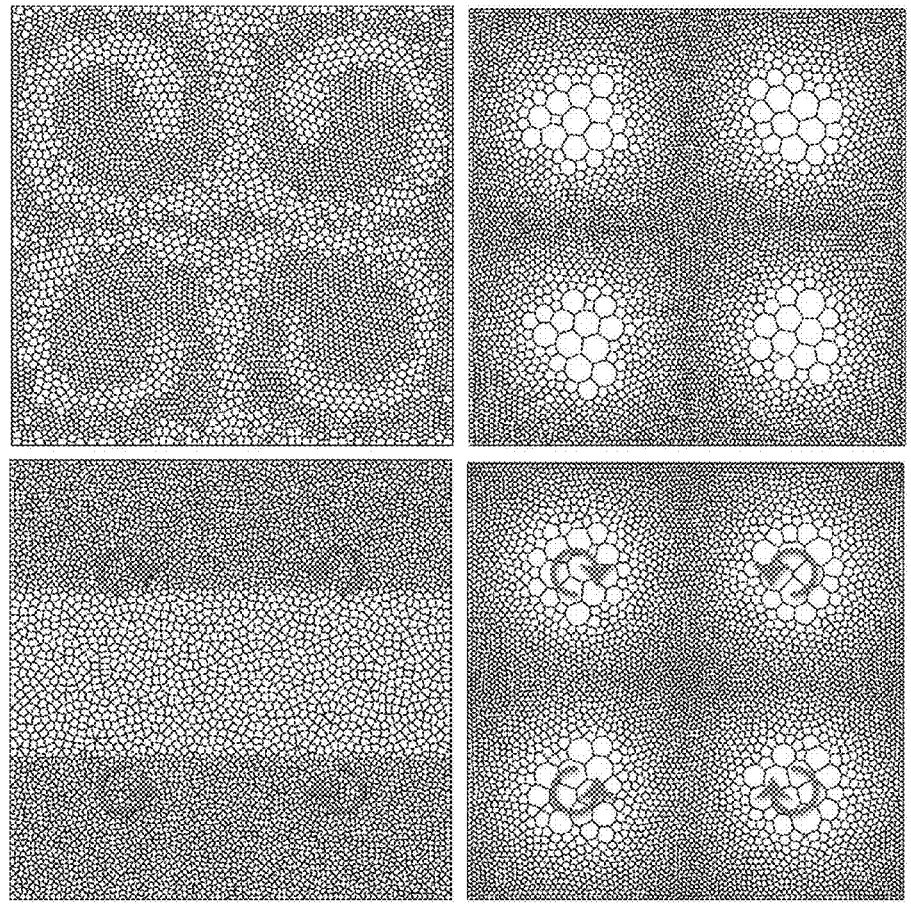
FIG. 10 is a diagram illustrating an incompressible flow simulated with power particles and initialized with different sampling patterns in accordance with an embodiment of the invention.

Initialization. Various embodiments of the invention instantiate a set of n power particles in the fluid domain $\Omega$ with prescribed cell volumes $\{\overline{V}_i\}_i$. This partitioning is initialized by first seeding sites $\{q_i\}_i$ on a grid inside $\Omega$, and then alternating Lloyd iterations and weight optimizations to form a centroidal power diagram. The resulting power particles are each given a density $p_i$ and a mass $m_i$ such that $m_i = p_i \overline{V}_i$, in addition to an initial velocity. The target volumes can be set to uniform values $\{\overline{V}_i = |\Omega|/n\}_i$, or initialized with an arbitrary density function. In the latter case, particles masses $\{m_i\}_i$ are no longer uniform in order to define a constant local density throughout the fluid. FIG. 10 shows an example of an incompressible flow initialized with different sampling patterns. Adaptive sampling of two dimensional fluids is illustrated in FIG. 10. The image is initialized with variable volume sized power cells (top left) and a velocity-adapted distribution of power cells (bottom left). A four-vortex example of fluid movement maintaining the flow symmetry over long periods of time in the directions of the arrows in the top right and top left sections (top right corresponding to top left over time; bottom right corresponding to bottom left over time).

External and viscosity forces. In several embodiments, a process for power diagram fluid simulation can be similar to a process illustrated in pseudocode shown in FIG. 11. The velocity of each power particle can be updated through an explicit time integration based on external forces, such as (but not limited to) gravity and/or buoyancy. For viscous flows, robustness to large viscosity coefficients can be ensured through an unconditionally stable implicit time integrator. In many embodiments, an intermediate velocity field can be found by solving the following sparse linear system:

$$[\text{diag}(V) - v dt L] v^* = \text{diag}(V)(v + dt \text{diag}(m)^{-1} F^{ext}) \quad (8)$$

where diag(V) and diag(m) are the diagonal matrices containing all local volumes and masses, respectively.

Incompressible flows. In several embodiments, incompressible fluids can be utilized where internal forces come directly from the gradient of pressure that enforces a divergence-free velocity field. In various embodiments, this pressure, as illustrated by Line 2 of pseudocode illustrated in FIG. 11 by solving for the scalars $\{p_i\}_i$ that satisfy the discrete Poisson equation given in Eq. (7). In addition to controlling the velocity divergence, incompressibility can be enforced geometrically by keeping the volume of each cell constant. This means that Line 4 of FIG. 11 is rendered unnecessary for incompressible flows as each $\overline{V}_i$ remains fixed throughout the animation. The weights are finally computed as described above.

Compressible flows. In many embodiments, the case of compressible fluids requires minor alterations. First, the pressure p in Line 2 is computed via a state equation. The simple constitutive law can be utilized in various embodiments:

$$p_i = \kappa m_i (1/V - 1/\overline{V}_i), \quad (9)$$

where $\kappa$ is tantamount to a stiffness parameter. The velocity is then updated with the pressure forces in Line 3 which, unlike in the incompressible case, will no longer result in a divergence-free field. The local volume change in Line 4 can be applied to induce the velocity divergence as an update of the target volumes $\{\overline{V}_i\}_i$, i.e.:

$$\overline{V}_i \leftarrow \overline{V}_i + dt[Dv]_i, \quad (10)$$

In many embodiments, the new volumes always sum up to the domain volume, $\Sigma_i \overline{V}_i = |\Omega|$, as a result of the definition of the divergence as described above verifying the identity $\Sigma_i [Dv]_i = 0$.

Multiphase flows. In several embodiments, power particles also accommodate the simulation of multiphase flows, i.e., when multiple fluid types interact within the same domain. For interacting fluids of the same kind but different densities, the process described in pseudocode in FIG. 11 can be applied with no modification other than proper initialization of the densities (and, consequently, of the masses) per particle. For the interaction of incompressible and compressible fluids, Lines 2 and 4 of FIG. 11 are implemented in such a way that compressible particles are updated through a pressure from a state equation, while incompressible particles are adjusted via a pressure projection. The pressure of the compressible particles along the fluids interface can be used to set the Dirichlet boundary condition for the pressure projection of the incompressible fluid in Eq (7).

Figure 12:
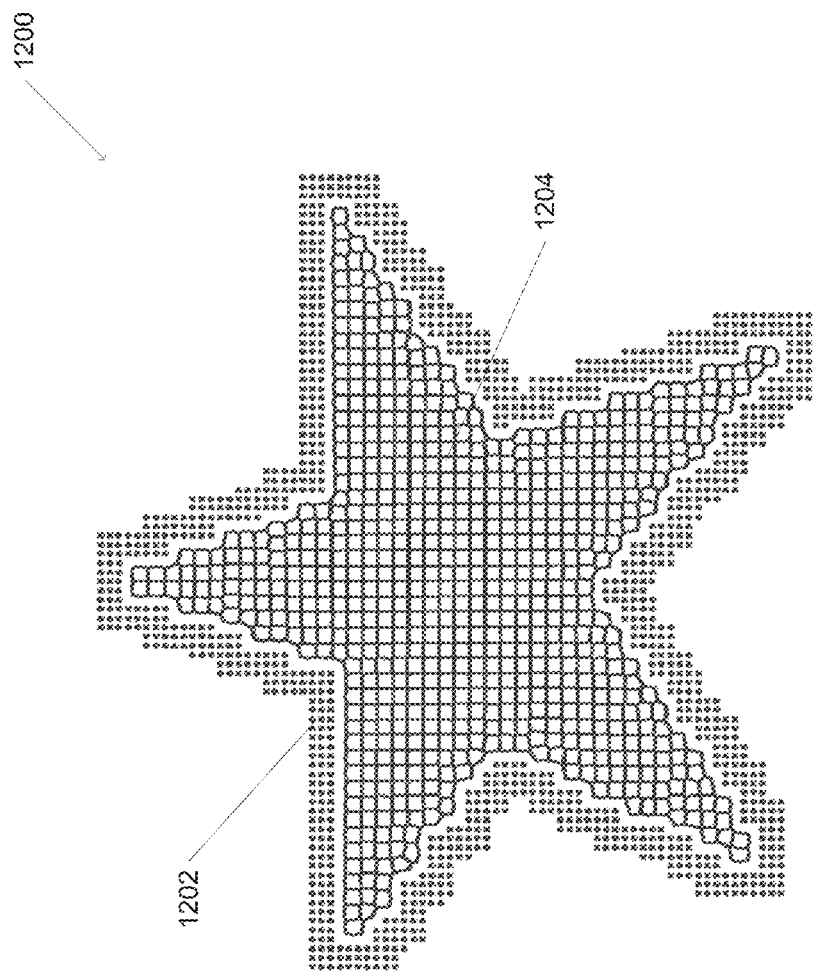
FIG. 12 is a diagram illustrating power particles surrounded by ghost air particles in accordance with an embodiment of the invention.

Free surfaces. In many other embodiments, when fluid simulations involving a moving interface between fluid and air are desired, free surfaces can be represented via air "ghost" particles. Before every simulation time step, air ghost particles can be populated in a band of thickness proportional to the smallest target volume $\overline{V}$. These ghost particles can then be used to clip the power cells of the fluid particles encroaching on this interface. Power particles surrounded by ghost air particles are illustrated in FIG. 12. The figure 1200 includes a band of power particles 1202 surrounding a group of power particles 1204. It should readily he appreciated that the shape, thickness etc. of the air particles and/or the power particles can change according to various embodiments of the invention. By simulating the fluid air interface using a thin layer of air particles (instead of simulating the entire volume of air) the computation involved in the simulation can be significantly reduced.

In many embodiments, the air particles can be exploited to impose proper boundary conditions at the fluid-air power facets $\mathcal{A}_{ij}$. In the divergence computation (Eq. (4)), the velocity of air particles can be equated to the fluid particle in order to enforce zero Neumann boundary condition. In the projection solve (Eq. (7)), the Dirichlet boundary condition p=0 can be satisfied on every interface facet $\mathcal{A}_{ij}$ between a fluid particle i and an air ghost particle j. The pressure valve $p_j$ can be computed so that a linear interpolation along the edge ij reaches zero at $\mathcal{A}_{ij}$, which is achieved with $p_j = -(d_{ji}/d_{ij})p_i$. Additionally, air particles can be set to zero weights and removed from the weight optimization (Eq. (3)), since their volumes are just temporary.

Figure 13:
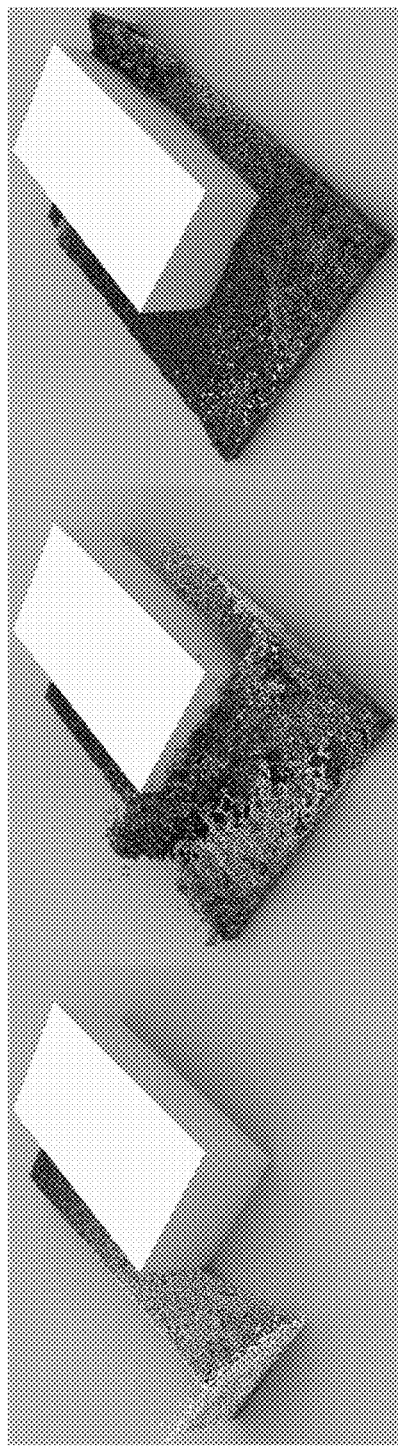
FIG. 13 is a diagram illustrating a wall confined damn break confined to a U-shaped corridor simulated with power particles in accordance with an embodiment of the invention.
Figure 14:
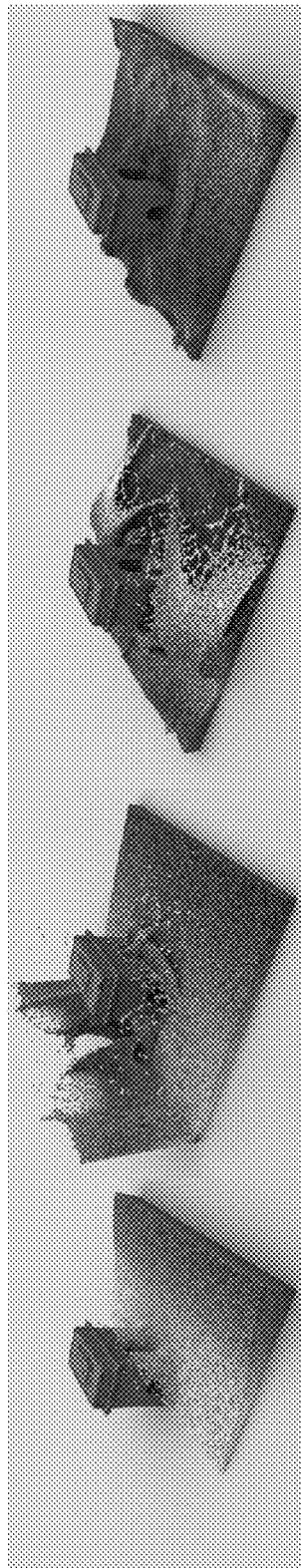
FIG. 14 is a diagram illustrating a dam break near the Arc de Triomphe simulated using power particles in accordance with an embodiment of the invention.

Obstacles. Processes in accordance with various embodiments of the invention are readily adaptable to the simulation of both rigid and deformable objects interacting with fluids. The object is simply described using its own set of particles. With rigid objects, the particles maintain a defined volume and are translated in accordance with a scripted motion modified based upon forces applied to surfaces of the object by the simulated fluid. Objects that are deformable can be simulated by determining force applied to the surfaces of the object by the fluid and then simulating the resulting deformation of the object in accordance with its prescribed deformation characteristics. In many embodiments of the invention, static or moving obstacles can be discretized by a power particle framework either as clipping objects or via solid ghost particles. Clipping can be more effective to represent simple obstacles, such as container walls in $\partial \Omega$ or convex objects as illustrated in FIG. 13. FIG. 13 further illustrates a wall-confined dam break confined to a U-shaped corridor simulated with 65k particles. Water first splashes against the opposite wall before ricocheting onto the inner wall and then splashing at the end of the domain. Solid particles are more practical to describe arbitrary shapes as illustrated in FIG. 14. FIG. 14 further illustrates a dam break near a simulated Arc de Triomphe using 600k particles for the fluid and 80k particles for the solid obstacle.

In contrast to air particles, solid particles are instantiated only once in the initialization step. The volumes of these solid particles can be maintained invariant in time by optimizing their weights in Eq. (3) along with all other fluid particles. In order to ensure Neumann boundary condition at a fluid-solid interface $\mathcal{A}_{ij}$, the boundary flux can be added $(A_{ij}/l_{ij})(q_j-q_i)^t v_j$ to the divergence of the fluid particle i in Eq. (4). For the pressure projection, a zero Neumann boundary condition can be set by removing the solid particles from Eq. (7). Additionally, particles in moving obstacles are also included in the cell advection as described above to make them follow a prescribed path. This simple treatment allows proper transfer of momentum to the fluid.

Surface Tension. In various embodiments, a fluid-air interface often exhibits surface tension due to a difference in cohesion forces on each side. It can be simulated as an elastic membrane, resulting in forces minimizing the interface area. The use of power particles can be particularly convenient as it can incorporate many of the existing strategies to approximate surface tension. Several embodiments in accordance with the invention can add the interface curvature as discontinuities of pressure in the projection step as illustrated in Line 3 of FIG. 11. More specifically, an area-weighted normal $n_i$ per particle i can be computed by summing area vectors of dual facets $\mathcal{A}_{ij}$ in the fluid-air interface, and deduce the mean curvature at interface particles as $\kappa=-D(n/\|n\|)$. The term $\tau(A_{ij}/l_{ij}) (d_{ji}\kappa_i + d_{ij}\kappa_j)$ can then be added to the right-hand side of Eq. (7) to account for the integrated curvature at the interface $A_{ij}$ scaled by the tension coefficient $\tau$.

Simulated Results

For many embodiments of the invention, a series of simulations were performed in order to validate the method both in terms of performance and visual quality. The simulated experiments are described, and results are discussed compared to previous works.

Figure 15:
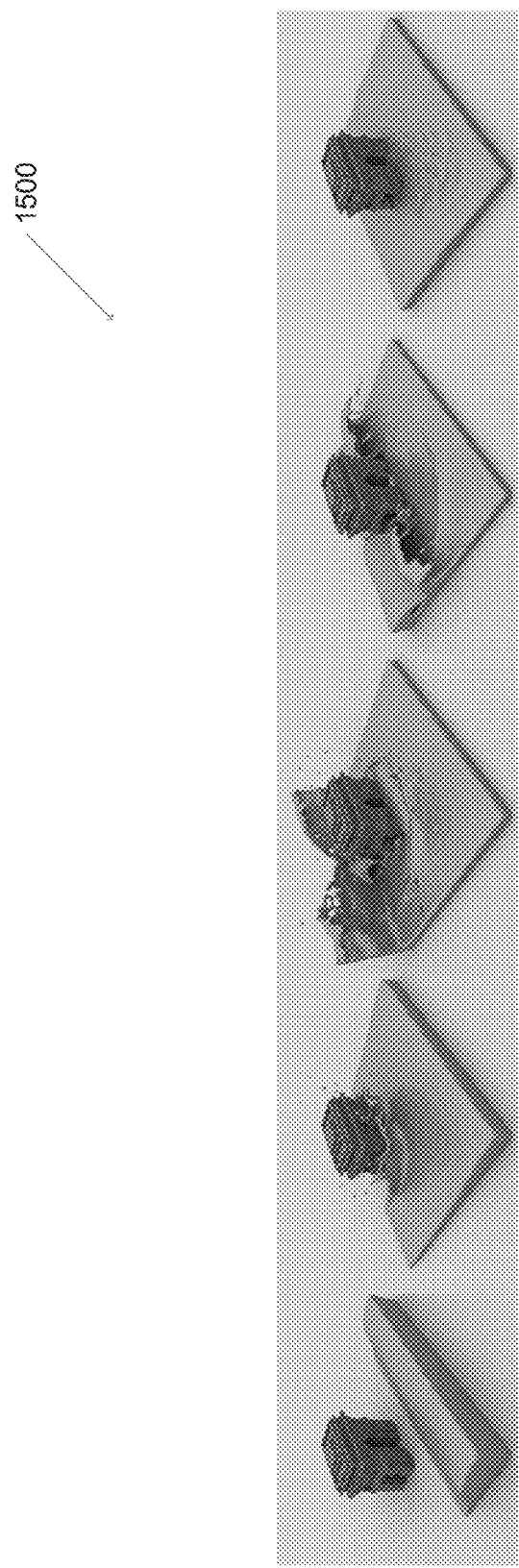
FIG. 15 is a diagram illustrating surfacing of the diagram shown in FIG. 14.

Implementation. In various embodiments, a simulated implementation is based on a thread-safe patch to the VORO++ library to construct clipped power diagrams in two dimensions and three dimensions. In contrast to approaches that tile the entire Euclidean space before clipping cells to the domain $\Omega$, VORO++ employs a local approach that calculates clipped power cell individually. In several embodiments, this strategy generates, in parallel, power cells for fluid and solid particles only—thus reducing the overhead of air particles and speeding up performance by two orders of magnitude compared to other approaches. A pre-conditioned conjugate gradient solver can be used or the sparse linear systems in Eqs. (3), (7) and (8). A substepping scheme can be adopted so that every substep dt satisfies the CFL condition $$dt < \max_i \sqrt[d]{V_i} / \max_i \|v_i\| (d = 2, 3),$$

and the sum of substeps between two frames is 1/24 s. In various embodiments of the invention, there were never were more than three substeps between two frames. The tolerance for volume enforcement is set as described above to 0.1%. which typically requires a single Newton step every simulation substep. The Mantra renderer in Houdini can be used for the final rendering. Open-VDB can be used for surfacing. FIG. 15 illustrates surfacing of the power diagram shown in FIG. 14 using OpenVDB. It should readily be appreciated that many other surfacing techniques can he utilized.

Figure 16A:
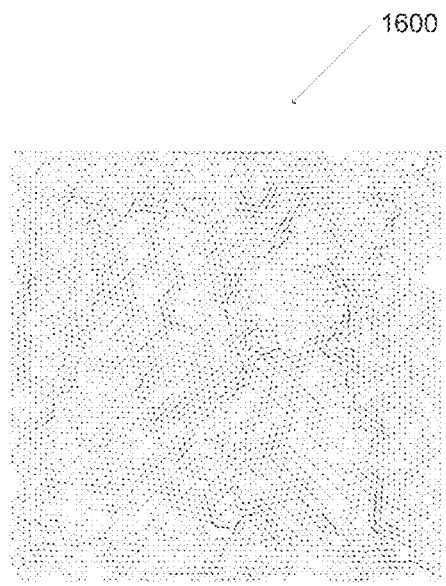
FIGS. 16A-16D are diagrams illustrating an animation for an incompressible flow with four vortices in a unit square using a density constrained method, a projection based method, combining a projection based method with particle smoothing, and a power diagram process in accordance with an embodiment of the invention respectively.
Figure 16B:
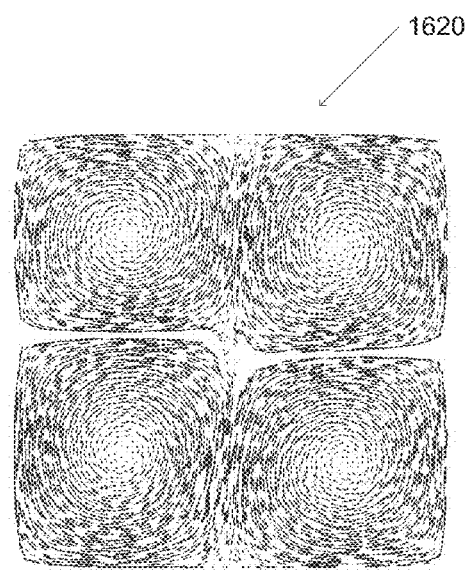
Figure 16C:
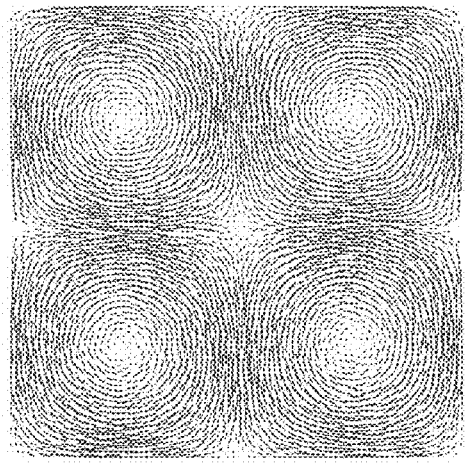
Figure 16D:
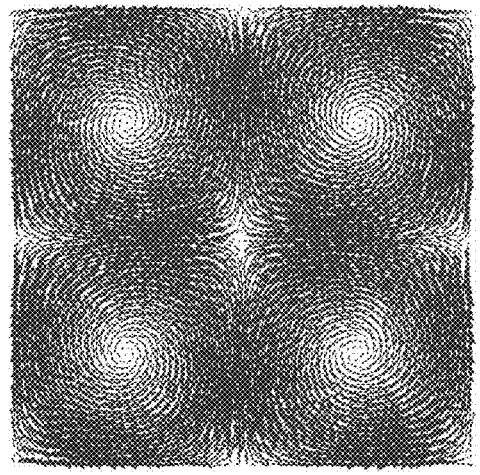

Simulations in Two Dimensions. In accordance with many embodiments of the invention, simulations in two dimensions include various features of the power particle framework, including splashes with air particles and surface tension, liquid falling onto multiple obstacles, and a fluid of uniform density but varying local volumes. Various other embodiments can also include simulations with and without weight optimization, demonstrating that the addition of weights keeps particle spacing, thus avoiding spurious drifting. FIGS. 16A-16D illustrate an animation for an incompressible flows with four vortices in a unit square. FIG. 16A illustrates a density constrained method such as Position Based Fluids (PBF) which keep a good particle distribution at the cost of significant motion damping. FIG. 16B illustrates a projection-based method such as FLIP, which can exhibit less artificial viscosity, but can fail to maintain spacing. FIG. 16C illustrates combining FLIP with particle smoothing which can restore evenly-spaced particles, but dissipates kinetic energy. FIG. 16D illustrates a power diagram process in accordance with an embodiment of the invention, which can preserve the flow symmetry over time and offer low dissipation. All simulated cases in FIGS. 16A-16D were initialized with the same distribution of 5k particles, and set a time step of dt=0.01.

Figure 17:
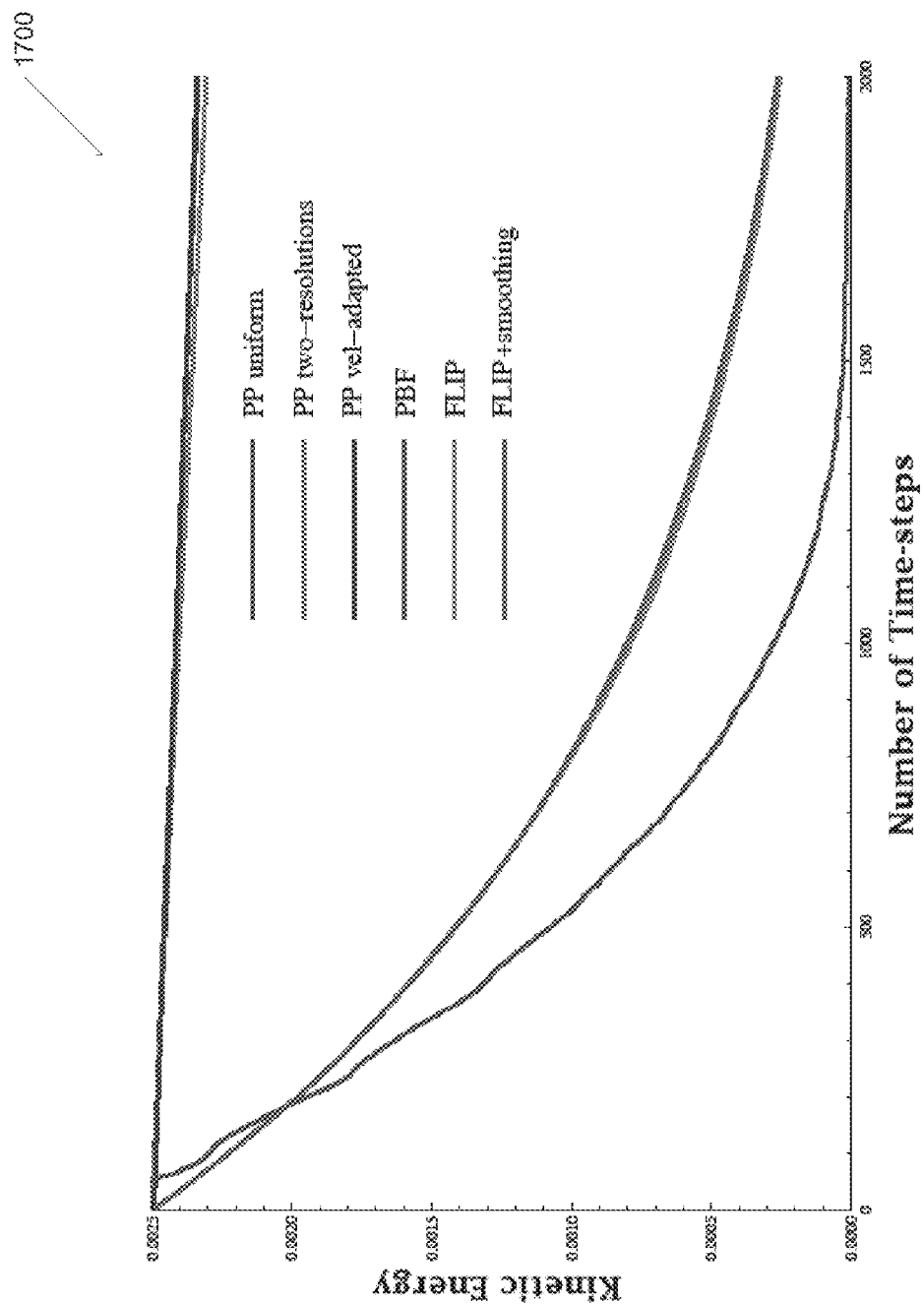
FIG. 17 is a diagram illustrating kinetic energy in time for the approaches illustrated in FIGS. 16A-16D.
Figure 18:
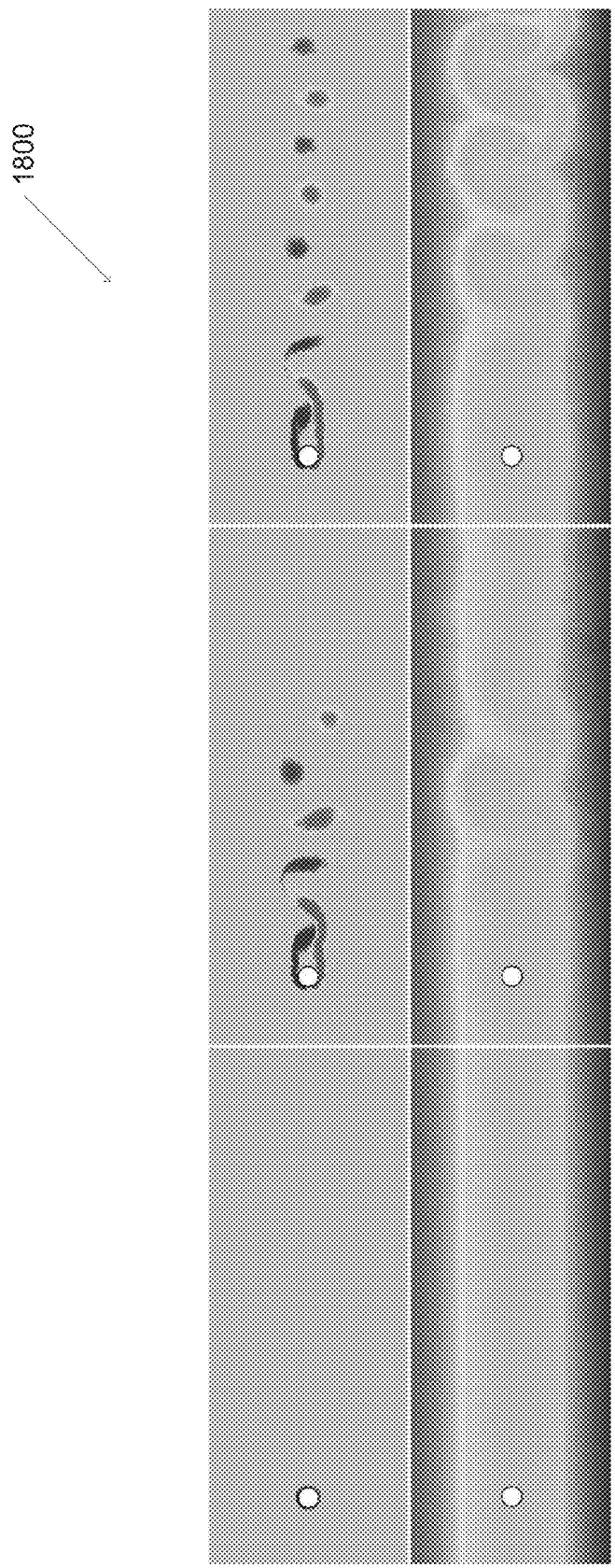
FIG. 18 is a diagram illustrating expected vortex shedding formed by the adherence of a fluid to a boundary in accordance with an embodiment of the invention.

Additionally, FIG. 17 illustrates the kinetic energy in time for the approaches illustrated in FIGS. 16A-16D. It can be noted that an embodiment of the present invention has the smallest decay rate, and provides consistent results even with adaptive sampling. The well-known case of a flow in a channel past a disk for a low viscosity fluid was also simulated. 20k particles with non-slip boundary conditions were used around the disk, and periodic boundary conditions through the vertical walls were used as a means to implement inlet and outlet particles in the flow direction. FIG. 18 illustrates the expected vortex shedding (von Kámán vortex street) formed by the adherence of the fluid to the boundary, in agreement with physical experiments. The wall-confined flow of an incompressible viscous fluid past a circular obstacle exhibits the expected von Kármán vortex street: the obstacle is "shedding" swirling vortices in its wake (top of FIG. 18 voracity plot; bottom of FIG. 18: advected dye).

Figure 19:
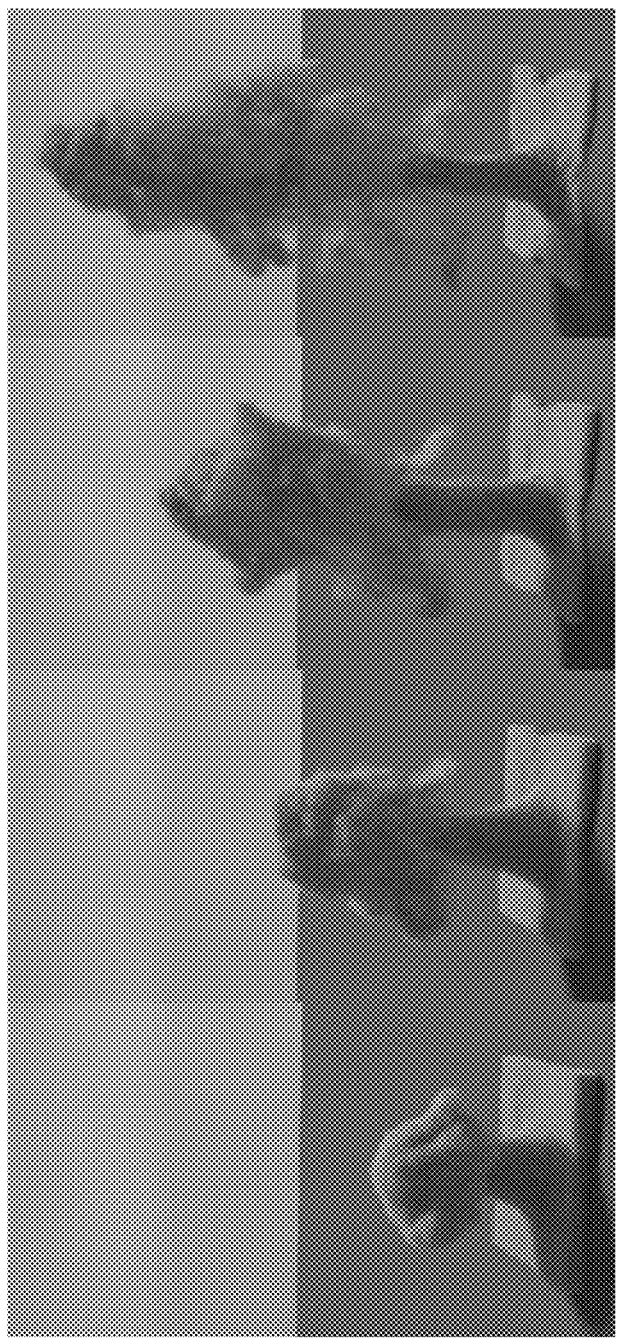
FIG. 19 is a diagram illustrating smoke simulated using power particles in a closed container in accordance with an embodiment of the invention.
Figure 20A:
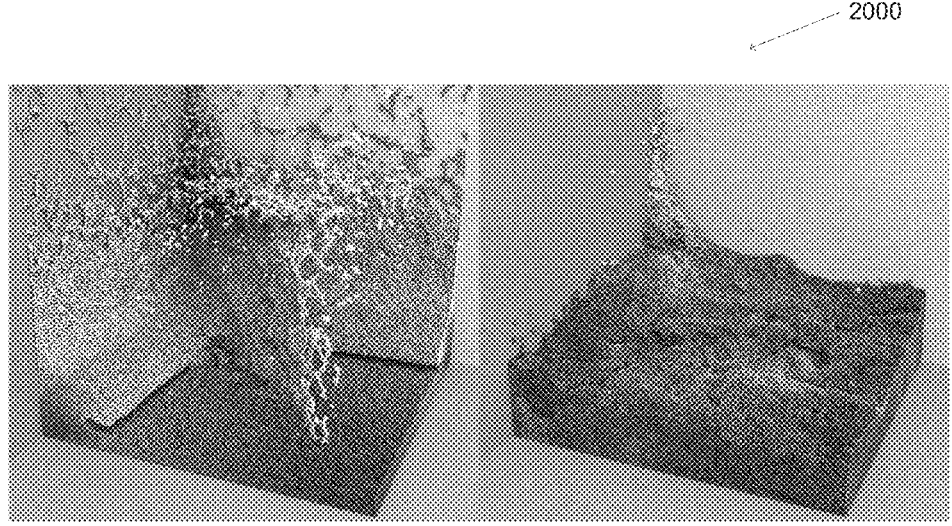
FIGS. 20A and 20B are diagrams illustrating a splash simulated using power diagrams in accordance with an embodiment of the invention.
Figure 20B:
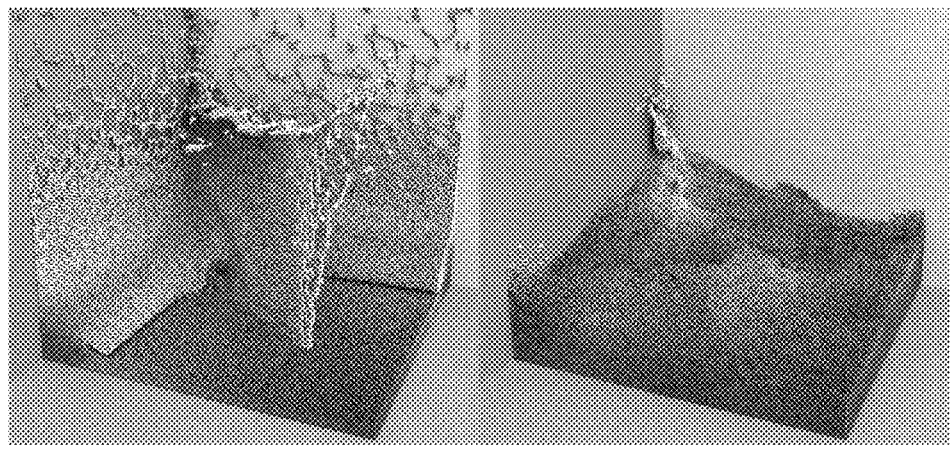
Figure 21:
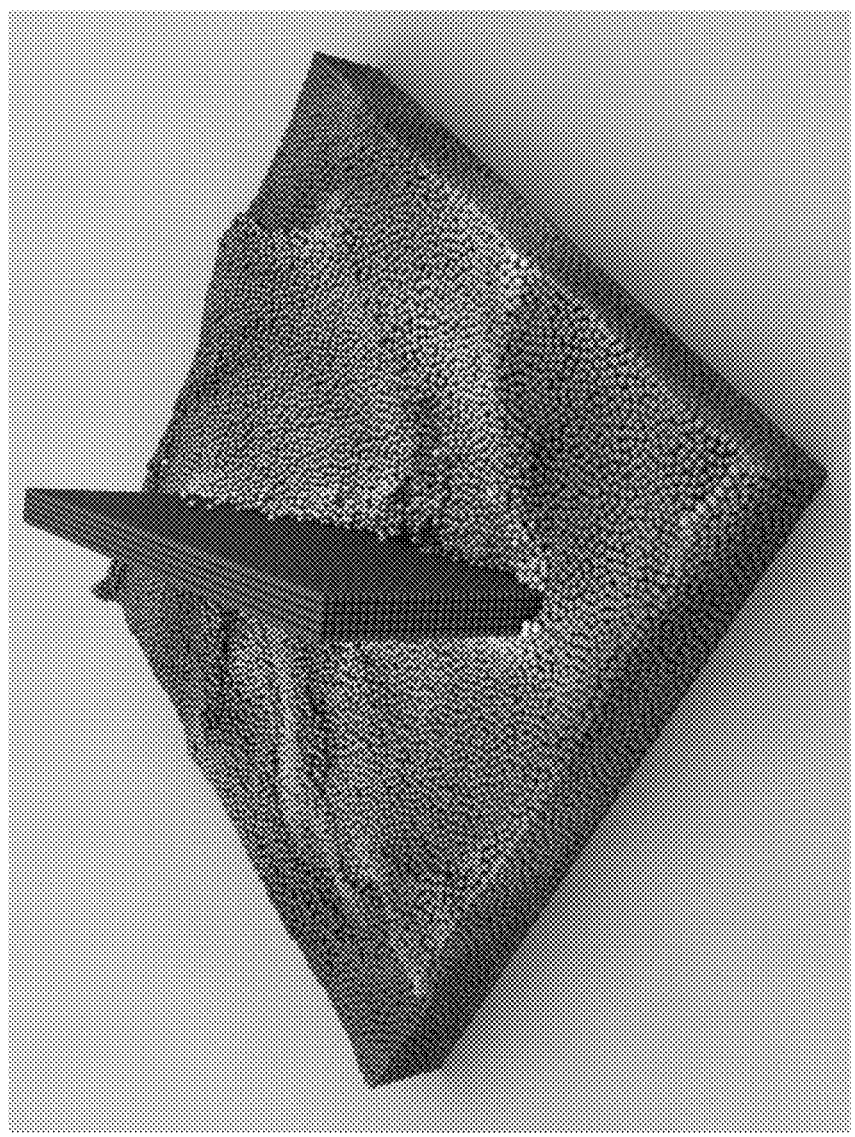
FIG. 21 is a diagram illustrating a turbulent flow simulated with power particles in accordance with an embodiment of the invention.

Simulations in Three Dimensions. In many embodiments, incompressible fluids were simulated in three dimensions. FIG. 19 illustrates a smoke simulation in a closed container filled with 20k power particles dragged by buoyancy forces and visualized by markers passively advected along the flow. For the images illustrated in FIG. 19, two million markers were advected passively along the power particle velocity field, forming a rising smoke cloud. In many other embodiments, free surface simulations are visualized utilizing the velocity magnitude via pseudocolors ranging from dark blue (low) to white (high). FIGS. 20A-20B illustrate a splash simulation with 450k particles using two different coefficients of viscosity. FIGS. 20A-20B further illustrate a simulated embodiment of the invention does not suffer from significant numerical dissipation and the effect of kinematic viscosity is finely captured: the same 450k particles simulation with viscosity v=0.001 (FIG. 20A) versus v=0.01 (FIG. 20B) exhibits a striking difference in turbulence. Times displayed are 1s (left portion of FIGS. 20A and 20B) and 4s (right portion of FIGS. 20A and 20B). FIG. 14 illustrates snapshots of a 600k-particle animation after surfacing, where a fluid comes splashing onto the Arc de Triomphe before subsiding. FIG. 21 illustrates a turbulent flow of 100k particles stirred by a spinning blade. FIG. 13 illustrates a liquid motion along a U-shaped corridor with 65k particles. Notice that even at a coarse particle resolution, various embodiments of the present invention can resolve detailed splashes and breaking waves with no significant visual dissipation.

Figure 9:
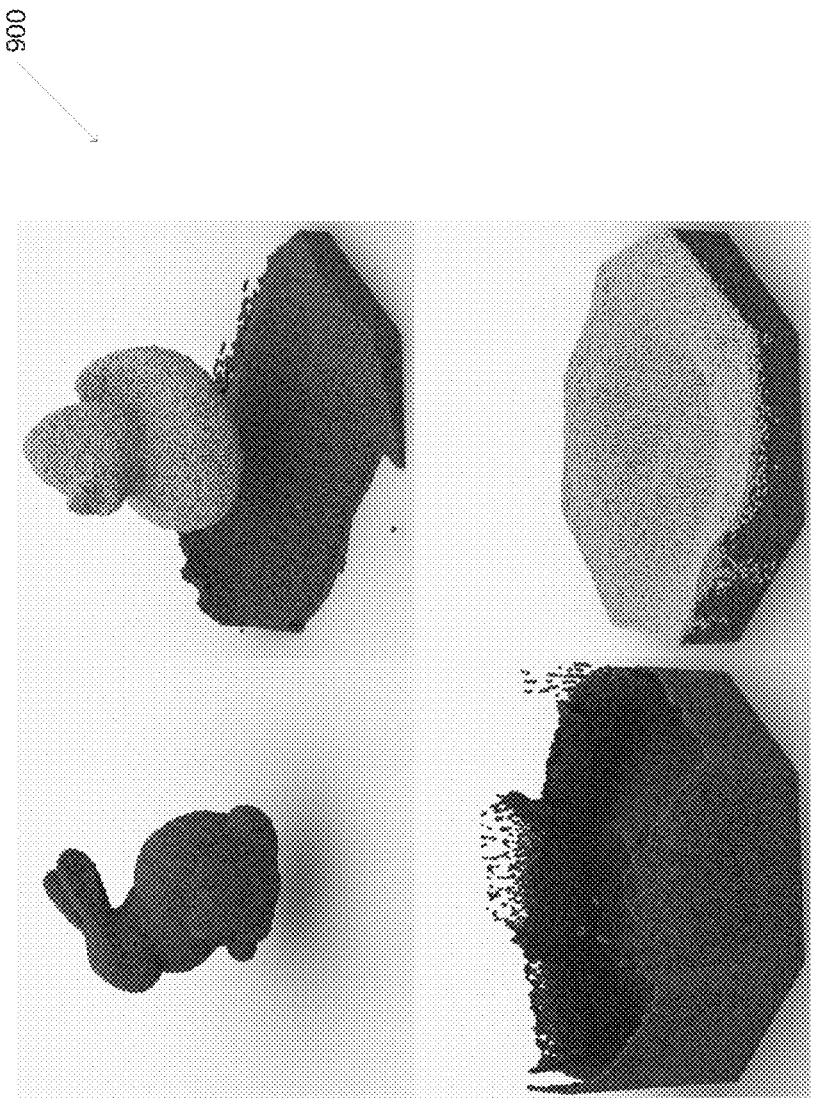
FIG. 9 is a diagram illustrating a three dimensional simulation using power particles of two incompressible fluids of different densities and volumes falling into an octagonal container in accordance with an embodiment of the invention.

Two-phase Flows. Many embodiments of the present invention can simulate fluids of variable density. Empirically, simulations were observed that were robust up to a density ratio of 30. FIG. 9 illustrates a three dimensional simulation with two incompressible fluids of different densities and local volumes falling into an octagonal container. The image 900 illustrates a heavy first fluid simulated with 130k particles is dropped into an octagonal container. A second fluid, which is four times lighter is dropped on top of the first fluid and is simulated with 70k particles. It should be readily appreciated that this simulation can be performed with different shaped containers, different numbers of fluids, different volumes of fluids, and/or different fluid densities.

Figure 22:
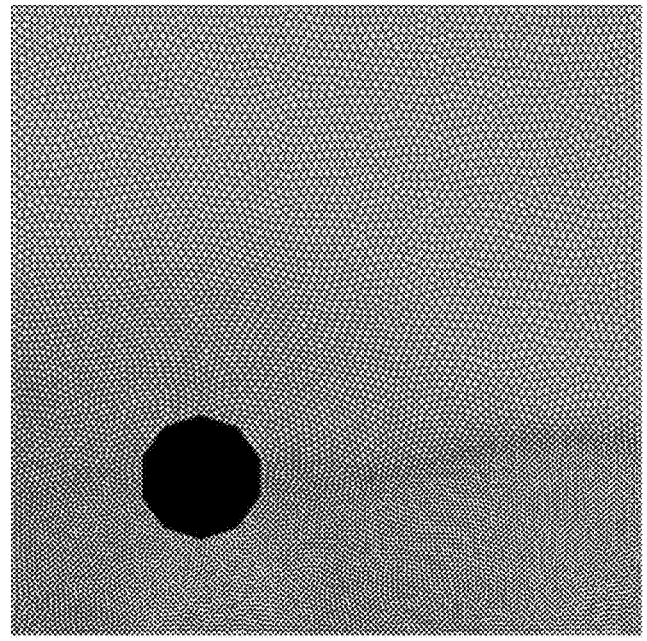
FIG. 22 is a diagram illustrating shallow water equations simulated using power particles in a square domain with a polygonal obstacle in accordance with an embodiment of the invention.
Figure 22:
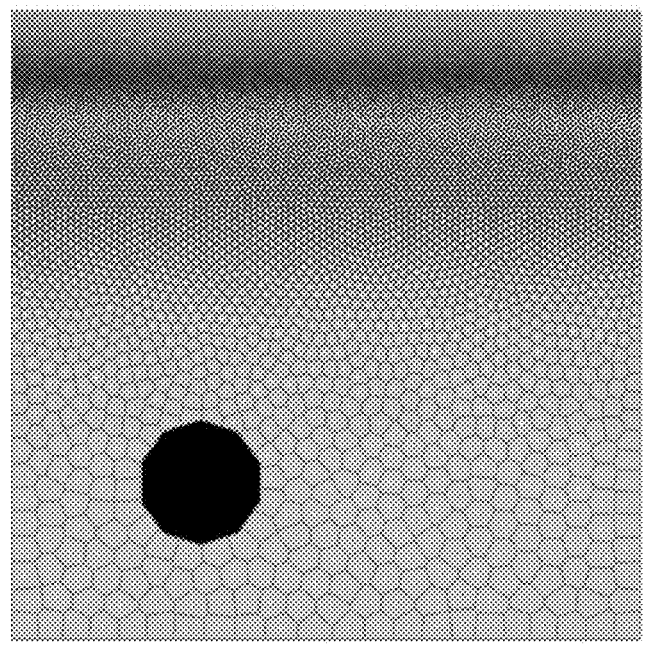

Compressible Flows. In various embodiments of the invention, compressible fluids can be simulated. Two dimensional compressible fluid models were utilized to simulate shallow water, which densities represent particle heights. FIG. 22 illustrates the smooth transition of power cell areas for a shallow water wave in a domain containing an obstacle in two dimensions. Power particles can handle compressible flows as well. As illustrated in FIG. 22, the shallow water equations are simulated in a square domain with a polygonal obstacle. Starting from a step-like height field (represented via color ramp), a wave comes crashing onto the obstacle and the left wall, creating a wide variety of particle sizes indicating various degrees of compression.

Simulated Performance. In various embodiments, simulations were clocked on an Intel Xeon 3.1 GHz workstation with 32 GB RAM and 12 cores. Simulations in two dimensions using between 5k and 20k particles took less than 10 milliseconds per substep. The average time spent per substep in three dimensions was 1 second for 20k particles as illustrated in FIG. 19, 2.7 seconds for 65k particles as illustrated in FIG. 13, 7 seconds for 100k particles as illustrated in FIG. 21, 17 seconds for 200k particles as illustrated in FIG. 9, 28 seconds for 450k particles as illustrated in FIGS. 20A-20B, and 34 seconds for 600k particles as illustrated in FIG. 14, indicating a linear asymptotic complexity with respect to the number of particles. For profiling purposes, the timing of one substep for a three dimensional simulation was also broken down with 1M particles: it took a total of 62.5 seconds, with 54% for a power diagram construction, 16% for a projection step, 11.2% for a diffusion solve, 9.6% for seeding air particles, and 9.2% for the weight update. In several embodiments of the invention, ghost particles create a memory overhead proportional to the surface area and particle size, varying from 30% up to 160% in FIG. 9. Overall, power diagram processes incur an increase in computational complexity when compared to state-of-the-art particle methods due to the construction and update of the power diagram. However, the benefits of this extra step are numerous, varying from significantly reduced numerical damping as illustrated in FIG. 16D to the ability to handle a large variety of fluids and their interactions with the environment. Consequently, many processes in accordance with embodiments of the invention reduce the wall-clock time to design a fluid animation sequence, as the results are consistent across time step and particle sizes, and no additional energy-injecting post-processing stages are required to obtain fine detail in the motion.

Although the present invention has been described in certain specific aspects, many additional modifications and variations would be apparent to those skilled in the art. It is therefore to be understood that the present invention can be practiced otherwise than specifically described without departing from the scope and spirit of the present invention including (but not limited to) changing the number of fluids simulated, the shape of the container fluids can be simulated in, the density of fluids, and/or other various fluid properties. For example, additional parameters can be added to the fluid to model diection of power cells to simulate fluid particles that have a directional character such as (but not limited to) liquid crystals. Similar techniques could be utilized in the simulation of magneto-hydrodynamics. Furthermore, a stressor field could be added to the simulation that moves with the power cells to enable simulation of visco-elasticity. Thus, embodiments of the present invention should be considered in all respects as illustrative and not restrictive. Accordingly, the scope of the invention should not be determined by the embodiments illustrated, but by the appended claims and their equivalents.

What is claimed is:

1. A system for generating computer graphics comprising:
   a processor; and
   a memory containing a model of a fluid, where the fluid is broken into a set of cells each defining a volume with boundaries that are relative to a distance of a set of points and the set of cells are continuous within the model of the fluid;
   wherein the processor is directed by a power particle application to:
      calculate a plurality of forces acting on the set of cells;
      move the set of cells within the model of the fluid based upon the plurality of forces; and
      update the model of the fluid with a new set of cells; wherein updating the model of the fluid comprises updating the volume of the set of cells with a local volume change using the following expression:

$$\bar{V}_i \leftarrow \bar{V}_i + dt[Dv]_i$$

where $\bar{V}$ is a target volume, i is a point in a cell in the set of cells, D is a divergence operator, and v is a velocity.

2. The system for generating computer graphics of claim 1, wherein the plurality of forces further comprises a velocity.

3. The system for generating computer graphics of claim 2, wherein the velocity is evaluated by the processor using the following expression:

$$\min_p \sum_i m_i \left\| v_i^* - \frac{dt}{m_i} [Gp]_i \right\|^2$$

where p is a pressure, i is a point in a cell in the set of cells, m is a mass, G is a gradient operator, and v* is an intermediate velocity.

4. The system for generating computer graphics of claim 1, wherein the plurality of forces further comprises pressure forces.

5. The system for generating computer graphics of claim 4, wherein the pressure forces are evaluated by the processor using the following expression:

dtLp=Dv* where L is a discrete Laplacian, p is a pressure force, D is a divergence operator, and v* is an intermediate velocity.

6. The system for generating computer graphics of claim 4, wherein the pressure forces are external forces.

7. The system for generating computer graphics of claim 4, wherein the pressure forces further comprises gravity.

8. The system for generating computer graphics of claim 1, wherein the forces acting on the set of cells further comprise an object.

9. The system for generating computer graphics of claim 8, wherein the object is a static object.

10. The system for generating computer graphics of claim 8, wherein the object is a dynamic object.

11. The system for generating computer graphics of claim 1, wherein the fluid is an incompressible fluid, and updating the model of the fluid further comprises keeping the volume of the set of cells constant.

12. The system for generating a computer graphics of claim 1, wherein the fluid is a compressible fluid.

13. The system for generating computer graphics of claim 1, wherein the model of the fluid further comprises multi-phase flows.

14. The system for generating computer graphics of claim 1, wherein the model of the fluid further comprises free surfaces surrounded by air cells.

15. The system for generating computer graphics of claim 1, wherein the power particle application further comprises a Lagrangian process.

16. The system for generating computer graphics of claim 1, wherein the model of the fluid further comprises a weighted Voronoi diagram.

17. The system for generating computer graphics of claim 1, wherein the set of cells are evaluated using the following expression:

$$V_i = \{x \in \Omega | \|x-q_i\|^2 - w_i \leq \|x-q_j\|^2 - w_j \forall_j\}$$

where V is a cell in the set of cells, $\Omega$ is the fluid model, $q_i$ is a point in the cell, $q_j$ is a neighboring point in the cell, and w is a weight.

18. The system for generating computer graphics of claim 1, wherein the model of the fluid is two dimensional.

19. The system for generating computer graphics of claim 1, wherein the model of the fluid is three dimensional.

* * * * *